(12) United States Patent
Son

(10) Patent No.: US 11,875,845 B2
(45) Date of Patent: Jan. 16, 2024

(54) MEMORY DEVICE AND OPERATING METHOD OF THE MEMORY DEVICE

(71) Applicant: SK hynix Inc., Icheon-si (KR)

(72) Inventor: Myeong Cheol Son, Icheon-si (KR)

(73) Assignee: SK hynix Inc., Icheon-si (KR)

(*) Notice: Subject to any disclaimer, the term of this patent is extended or adjusted under 35 U.S.C. 154(b) by 162 days.

(21) Appl. No.: 17/512,128

(22) Filed: Oct. 27, 2021

(65) Prior Publication Data

US 2022/0375514 A1 Nov. 24, 2022

(30) Foreign Application Priority Data

May 18, 2021 (KR) ........................ 10-2021-0064410

(51) Int. Cl.
| | | |
|---|---|---|
| G11C 11/56 | (2006.01) | |
| G11C 16/34 | (2006.01) | |
| G11C 16/10 | (2006.01) | |
| G11C 16/04 | (2006.01) | |

(52) U.S. Cl.
CPC ...... *G11C 11/5628* (2013.01); *G11C 11/5671* (2013.01); *G11C 16/0483* (2013.01); *G11C 16/10* (2013.01); *G11C 16/3445* (2013.01); *G11C 16/3459* (2013.01)

(58) Field of Classification Search
None
See application file for complete search history.

(56) References Cited

U.S. PATENT DOCUMENTS

| | | | | |
|---|---|---|---|---|
| 2008/0094893 A1* | 4/2008 | Choi | ............... | G11C 16/3454 365/185.03 |
| 2011/0051520 A1* | 3/2011 | Kim | ............... | G11C 16/0483 365/185.11 |
| 2012/0008389 A1* | 1/2012 | Kim | ............... | G11C 11/5642 365/185.18 |
| 2012/0044771 A1* | 2/2012 | Joo | ............... | G11C 16/3459 365/185.22 |
| 2016/0071595 A1* | 3/2016 | Dong | ............... | G11C 16/3459 365/185.17 |
| 2016/0203875 A1* | 7/2016 | Vali | ............... | G11C 16/3436 711/154 |
| 2017/0200510 A1* | 7/2017 | Hung | ............... | G11C 11/5642 |
| 2018/0019015 A1* | 1/2018 | Kwon | ............... | G11C 8/08 |
| 2020/0365218 A1* | 11/2020 | Yang | ............... | G11C 11/5635 |

FOREIGN PATENT DOCUMENTS

| | | |
|---|---|---|
| KR | 1020090094350 A | 9/2009 |
| KR | 101674070 B1 | 11/2016 |

\* cited by examiner

*Primary Examiner* — Douglas King
(74) *Attorney, Agent, or Firm* — William Park & Associates Ltd.

(57) ABSTRACT

There is provided a method for operating a memory device for performing a program operation of programming data in selected memory cells among a plurality of memory cells. The method includes: applying a program voltage to the selected memory cells; verifying program states of memory cells programmed to any one program state among a plurality of program states distinguished based on a plurality of threshold voltages among the selected memory cells; and verifying an erase state of memory cells programmed to an erase state among the selected memory cells.

19 Claims, 20 Drawing Sheets

MEMORY DEVICE AND OPERATING METHOD OF THE MEMORY DEVICE

CROSS-REFERENCE TO RELATED APPLICATION

The present application claims priority under 35 U.S.C. § 119(a) to Korean patent application number 10-2021-0064410, filed on May 18, 2021, in the Korean Intellectual Property Office, the entire disclosure of which is incorporated herein by reference.

BACKGROUND

1. Technical Field

The present disclosure generally relates to an electronic device, and more particularly, to a memory device and an operating method of the memory device.

2. Related Art

A storage device is a device which stores data under the control of a host device such as a computer or a smart phone. The storage device may include a memory device for storing data and a memory controller for controlling the memory device. The memory device is classified into a volatile memory device and a nonvolatile memory device.

The volatile memory device is a memory device in which data is stored only when power is supplied, and stored data disappears when the supply of power is interrupted. The volatile memory device may include a Static Random Access Memory (SRAM), a Dynamic Random Access Memory (DRAM), and the like.

The nonvolatile memory device is a memory device in which data is not lost even when the supply of power is interrupted. The nonvolatile memory device may include a Read Only Memory (ROM), a Programmable ROM (PROM), an Electrically Programmable ROM (EPROM), an Electrically Erasable ROM (EEROM), a flash memory, and the like.

SUMMARY

In accordance with an aspect of the present disclosure, there is provided a method for operating a memory device for performing a program operation of programming data in selected memory cells among a plurality of memory cells, the method may include: applying a program voltage to the selected memory cells; verifying program states of memory cells programmed to any one program state among a plurality of program states distinguished based on a plurality of threshold voltages among the selected memory cells; and verifying an erase state of memory cells programmed to an erase state among the selected memory cells.

In accordance with another aspect of the present disclosure, there is provided a method for operating a memory device for performing a program operation of programming data in selected memory cells among a plurality of memory cells, the method may include: performing a plurality of program loops including a program voltage apply operation of applying a program voltage to the selected memory cells and a verify operation of verifying at least one of program states and an erase state of the selected memory cells; verifying program states of memory cells programmed to a specific program state among the selected memory cells in a verify operation included in at least one program loop corresponding to the specific program state among the plurality of program loops; and verifying an erase state of memory cells programmed to an erase state among the selected memory cells in the verify operation included in the at least one program loop corresponding to the specific program state.

In accordance with still another aspect of the present disclosure, there may be provided a memory device including: a plurality of memory cells; a peripheral circuit configured to perform a plurality of program loops including a program voltage apply operation of applying a program voltage to selected memory cells among the plurality of memory cells and a verify operation of verifying program states of the selected memory cells; and a program operation controller configured to control the peripheral circuit to program data in the selected memory cells according to the plurality of program loops, wherein the program operation controller controls the peripheral circuit to verify program states of memory cells programmed to any one program state among a plurality of program states distinguished based on a plurality of threshold voltages among the selected memory cells in the verify operation, and verify an erase state of memory cells programmed to an erase state among the selected memory cells.

BRIEF DESCRIPTION OF THE DRAWINGS

Examples of embodiments will now be described hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Embodiments provide a memory device capable of preventing read fail caused by memory cells in an erase state, and an operating method of the memory device.

Figure 1:
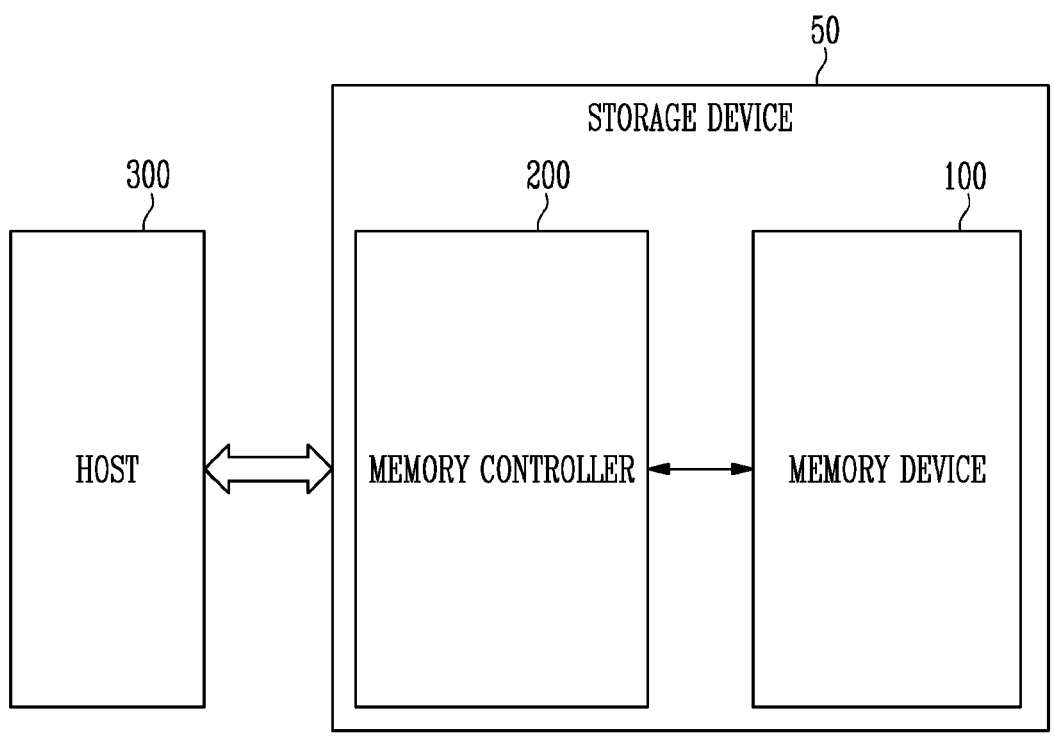
FIG. 1 is a diagram illustrating a storage device in accordance with an embodiment of the present disclosure.

FIG. 1 is a diagram illustrating a storage device in accordance with an embodiment of the present disclosure.

Referring to FIG. 1, the storage device 50 may include a memory device 100 and a memory controller 200 for controlling an operation of the memory device 100. The storage device 50 may be a device for storing data under the control of a host 300, such as a mobile phone, a smart phone, an MP3 player, a laptop computer, a desktop computer, a game console, a TV, a tablet PC or an in-vehicle infotainment system.

The storage device 50 may be manufactured as any one of various types of storage devices according to a host interface that is a communication scheme with the host 300. For example, the storage device 50 may be implemented with any one of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 50 may be manufactured as any one of various kinds of package types. For example, the storage device 50 may be manufactured as any one of various kinds of package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 may operate under the control of the memory controller 200. The memory device 100 may include a memory cell array (not shown) including a plurality of memory cells for storing data.

Each of the memory cells may be configured as any one of a Single Level Cell (SLC) storing one data bit, a Multi-Level Cell (MLC) storing two data bits, a Triple Level Cell (TLC) storing three data bits, and a Quadruple Level Cell (QLC) storing four data bits.

The memory cell array (not shown) may include a plurality of memory blocks. Each memory block may include a plurality of memory cells. One memory block may include a plurality of pages. In an embodiment, the page may be a unit for storing data in the memory device 100 or reading data stored in the memory device 100. The memory block may be a unit for erasing data.

In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, for convenience of description, a case where the memory device 100 is a NAND flash memory is assumed and described.

The memory device 100 may receive a command CMD and an address ADDR from the memory controller 200, and access an area selected by the address ADDR in the memory cell array. The memory device 100 may perform an operation indicated by the command CMD on the area selected by the address ADDR. For example, the memory device 100 may perform a write operation (program operation), a read operation, and an erase operation. In the program operation, the memory device 100 may program data in the area selected by the address ADDR. In the read operation, the memory device 100 may read data from the area selected by the address ADDR. In the erase operation, the memory device 100 may erase data stored in the area selected by the address ADDR.

Meanwhile, in FIG. 1, it is illustrated that one memory device 100 is included in the storage device 50. However, in some embodiments, the storage device 50 may include a plurality of memory devices.

The memory controller 200 may control overall operations of the storage device 50.

When power is applied to the storage device 50, the memory controller 200 may execute firmware (FW). When the memory device 100 is a flash memory device, the FW may include a host interface layer (HIL) for controlling communication with the host 300, a flash translation layer (FTL) for controlling communication between the host and the memory device 100, and a flash interface layer (FIL) for controlling communication with the memory device 100.

In an embodiment, the memory controller 200 may receive data and a Logical Block Address (LBA) from the host 300, and translate the LBA into a Physical Block Address (PBA) representing addresses of memory cells included in the memory device 100, in which data is to be stored. In this specification, the LBA and a "logic address" or "logical address" may be used with the same meaning. In this specification, the PBA and a "physical address" may be used with the same meaning.

The memory controller 200 may control the memory device 100 to perform a program operation, a read operation, an erase operation, or the like in response to a request from the host 300. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may be connected to the memory device 100 through a channel. For example, the memory controller 200 may provide a command and an address to the memory device through the channel, to control the memory device 100 to perform a program operation, a read operation, an erase operation, or the like.

In an embodiment, the memory controller 200 may autonomously generate a command, an address, and data regardless of any request from the host 300, and transmit the command, the address, and the data to the memory device 100. For example, the memory controller 200 may provide the memory device 100 with a command, an address, and data, which are used to perform read and program operations accompanied in performing wear leveling, read reclaim, garbage collection, etc.

In an embodiment, the memory controller 200 may control at least two memory devices 100. The memory controller 200 may control the memory devices according to an interleaving scheme so as to improve operational performance. The interleaving scheme may be a scheme for controlling operations on at least two memory devices 100 to overlap with each other.

The host 300 may communicate with the storage device 50, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
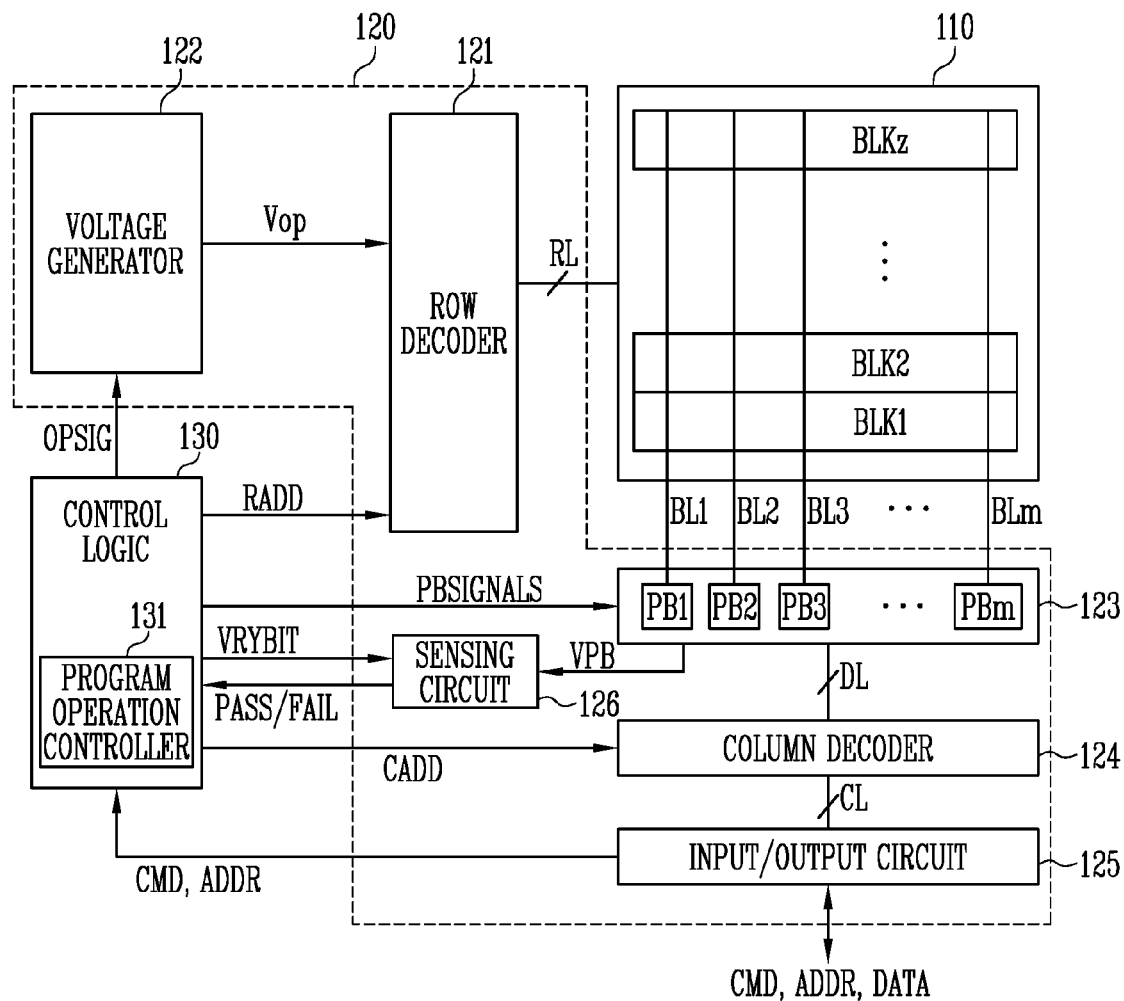
FIG. 2 is a diagram illustrating a memory device shown in FIG. 1.

FIG. 2 is a diagram illustrating the memory device shown in FIG. 1.

Referring to FIG. 2, the memory device 100 may include a memory cell array 110, a peripheral circuit 120, and control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 includes a plurality of memory blocks BLK1 to BLKz. The plurality of memory blocks BLK1 to BLKz are connected to a row decoder 121 through row lines RL. The plurality of memory blocks BLK1 to BLKz are connected to a page buffer group 123 through bit lines BL1 to BLm. Each of the plurality of memory blocks BLK1 to BLKz includes a plurality of memory cells. In an embodiment, the plurality of memory cells may be nonvolatile memory cells. Memory cells connected to the same word line may be defined as one page. Therefore, one memory block may include a plurality of pages.

The row lines RL may include at least one source select line, a plurality of word lines, and at least one drain select line.

Each of the memory cells included in the memory cell array 110 may be configured as a Single Level Cell (SLC) storing one data bit, a Multi-Level Cell (MLC) storing two data bits, a Triple Level Cell (TLC) storing three data bits, or a Quadruple Level Cell (QLC) storing four data bits.

The peripheral circuit 120 may perform a program operation, a read operation or an erase operation on a selected region of the memory cell array 110 under the control of the control logic 130. The peripheral circuit 120 may drive the memory cell array 110. For example, the peripheral circuit 120 may apply various operating voltages to the row lines RL and the bit lines BL1 to BLm or discharge the applied voltages under the control of the control logic 130.

The peripheral circuit 120 may include the row decoder 121, the voltage generator 122, the page buffer group 123, a column decoder 124, an input/output circuit 125, and a sensing circuit 126.

The row decoder 121 is connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 operates under the control of the control logic. The row decoder 121 receives a row address RADD from the control logic 130.

The row decoder 121 decodes the row address RADD. The row decoder 121 selects at least one memory block among the memory blocks BLK1 to BLKz according to the decoded address. Also, the row decoder 121 may select at least one word line of the selected memory block to apply voltages generated by the voltage generator 122 to the at least one word line WL according the decoded address.

For example, in a program operation, the row decoder 121 may apply a program voltage to the selected word line, and apply a program pass voltage having a level lower than that of the program voltage to unselected word lines. In a program verify operation, the row decoder 121 may apply a verify voltage to the selected word line, and apply a verify pass voltage having a level higher than that of the verify voltage to the unselected word lines.

In a read operation, the row decoder 121 may apply a read voltage to the selected word line, and apply a read pass voltage having a level higher than that of the read voltage to the unselected word lines.

In an embodiment, an erase operation of the memory device 100 is performed in a memory block unit. In the erase operation, the row decoder 121 may select one memory block according to the decoded address. In the erase operation, the row decoder 121 may apply a ground voltage to word lines connected to the selected memory blocks.

The voltage generator 122 operates under the control of the control logic 130. The voltage generator 122 generates a plurality of voltages by using an external power voltage supplied to the memory device 100. Specifically, the voltage generator may generate various operating voltages Vop used in program, read, and erase operations in response to an operation signal OPSIG. For example, the voltage generator 122 may generate a program voltage, a verify voltage, a pass voltage, a read voltage, an erased voltage, and the like under the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of voltages by using the external power voltage or the internal power voltage.

For example, the voltage generator 122 may include a plurality of pumping capacitors for receiving the internal power voltage, and generate the plurality of voltages by selectively activating the plurality of pumping capacitors under the control of the control logic 130.

The plurality of generated voltages may be supplied to the memory cell array 110 by the row decoder 121.

The page buffer group 123 includes first to mth page buffers PB1 to PBm. The first to mth page buffers PB1 to PBm are connected to the memory cell array 110 respectively through first to mth bit lines BL1 to BLm. The first to mth bit lines BL1 to BLm operate under the control of the control logic 130. Specifically, the first to mth bit lines BL1 to BLm may operate in response to page buffer control signals PBSIGNALS. For example, the first to mth page buffers PB1 to PBm may temporarily store data received through the first to mth bit lines BL1 to BLm, or sense a voltage or current of the bit lines BL1 to BLm in a read or verify operation.

Specifically, in a program operation, the first to mth page buffers PB1 to PBm may transfer data DATA received through the input/output circuit 125 to selected memory cells through the first to mth bit lines BL1 to BLm, when a program voltage is applied to a selected word line. Memory cells of a selected page are programmed according to the transferred data DATA. A memory cell connected to a bit line to which a program allow voltage (e.g., a ground voltage) is applied may have an increased threshold voltage. A threshold voltage of a memory cell connected to a bit line to which a program inhibit voltage (e.g., a power voltage) is applied may be maintained. In a program verify operation, the first to mth page buffers PB1 to PBm read page data from the selected memory cells through the first to mth bit lines BL1 to BLm.

In a read operation, the first to mth page buffers PB1 to PBm read data DATA from the memory cells of the selected page through the first to mth bit lines BL1 to BLm, and outputs the read data DATA to the input/output circuit 125 under the control of the column decoder 124.

In an erase operation, the first to mth page buffers PB1 to PBm may float the first to mth bit lines BL1 to BLm.

The column decoder 124 may communicate data between the input/output circuit 125 and the page buffer group 123 in response to a column address CADD. For example the column decoder 124 may communicate data with the first to mth page buffers PB1 to PBm through data lines DL, or communicate data with the input/output circuit 125 through column lines CL.

The input/output circuit 125 may transfer a command CMD and an address ADDR, which are received from the memory controller 200 described with reference to FIG. 1, to the control logic 130, or exchange data DATA with the column decoder 124.

In a read operation or verify operation, the sensing circuit 126 may generate a reference current in response to an allow bit VRYBIT signal, and output a pass or fail signal PASS/FAIL by comparing a sensing voltage VPB received from the page buffer group 123 and a reference voltage generated by the reference current.

The control logic 130 may control the peripheral circuit 120 by outputting the operation signal OPSIG, the row address RADD, the page buffer control signals PBSIGNALS, and the allow bit VRYBIT in response to the command CMD and the address ADDR. Also, the control logic 130 may determine whether the verify operation has passed or failed in response to the pass or fail signal PASS or FAIL.

In an embodiment, the control logic 130 may include a program operation controller 131.

The program operation controller 131 may control the peripheral circuit 120 to perform a program operation. For example, the program operation controller 131 may control the peripheral circuit 120 to program data in selected memory cells among a plurality of memory cells according to a plurality of program loops. The peripheral circuit 120 may perform a plurality of program loops. Each of the plurality of program loops may include a program voltage apply operation and a verify operation. A program operation including a plurality of program loops will be described with reference to FIG. 6 which will be described later.

In an embodiment, the program operation controller 131 may control the peripheral circuit 120 to apply a program voltage to selected memory cells in the program voltage apply operation. Also, the program operation controller 131 may control the peripheral circuit 120 to verify a program state of memory cells programmed to any one program state among the selected memory cells in the verify operation. A plurality of program states may be distinguished based on a plurality of threshold voltages. Therefore, the program operation controller 131 may detect the program state of the memory cells by applying first verify voltage for distinguishing the plurality of program states to a selected word line connected to the selected memory cells. The first verify voltage may be a voltage used to verify the program state.

In an embodiment, when a threshold voltage of memory cells programmed to any one program state is lower than the first verify voltage, the program operation controller 131 may determine that a verify operation on the corresponding program state has failed. The program operation controller 131 may control the peripheral circuit 120 to perform a next program loop.

In an embodiment, the program operation controller 131 may control the peripheral circuit 120 to verify an erase state of memory cells programmed to an erase state among the selected memory cells. The program operation controller 131 may verify the erase state of the memory cells by applying a second verify voltage to the selected word line. The second verify voltage may be lower than the first verify voltage. Also, the second verify voltage may include a negative verify voltage.

In an embodiment, when a threshold voltage of the memory cells programmed to the erase state is higher than the second verify voltage, the program operation controller 131 may determine that a verify operation on the erase state has failed. Also, when it is determined that the verify operation on the erase state has failed, the program operation controller 131 may control the peripheral circuit 120 to program data in other memory cells except the selected memory cells among the plurality of memory cells.

Thus, in accordance with the embodiment of the present disclosure, the erase state of the memory cells programmed to the erase state is verified during the program operation, so that read fail caused by the memory cells in the erase state can be prevented.

Meanwhile, the verify operation on the erase state may be performed in accordance with various embodiments.

For example, after a verify operation on a plurality of program states passes, the program operation controller 131 may control the peripheral circuit 120 to verify an erase state of memory cells programmed to an erase state.

In another example, after a verify operation on a plurality of program states passes, the program operation controller 131 may apply a predetermined lowest program voltage to selected memory cells. Also, after the lowest program voltage is applied to the selected memory cells, the program operation controller 131 may verify an erase state of memory cells programmed to the erase state. The word "predetermined" as used herein with respect to a parameter, such as a predetermined lowest program voltage, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

In still another embodiment, the program operation controller 131 control the peripheral circuit 120 to verify an erase state of memory cells programmed to the erase state among selected memory cells in a verify operation of at least one program loop corresponding to a specific program state among a plurality of program loops. The program operation controller 131 may control the peripheral circuit 120 to verify a program state of memory cells programmed to a specific program state and an erase state of memory cells programmed to the erase state in a verify operation of at least one program loop corresponding to the program state. In an embodiment, the specific program state may include a program state having a higher threshold voltage than the other program states among a plurality of program states.

Figure 3:
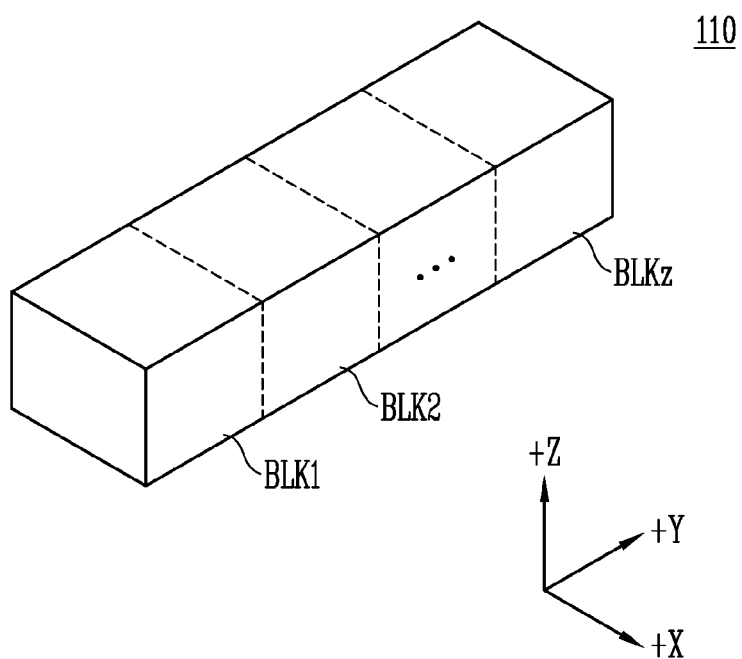
FIG. 3 is a diagram illustrating an embodiment of a memory cell array shown in FIG. 2.

FIG. 3 is a diagram illustrating an embodiment of the memory cell array shown in FIG. 2.

Referring to FIG. 3, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block will be described below with reference to FIGS. 4 and 5.

Figure 4:
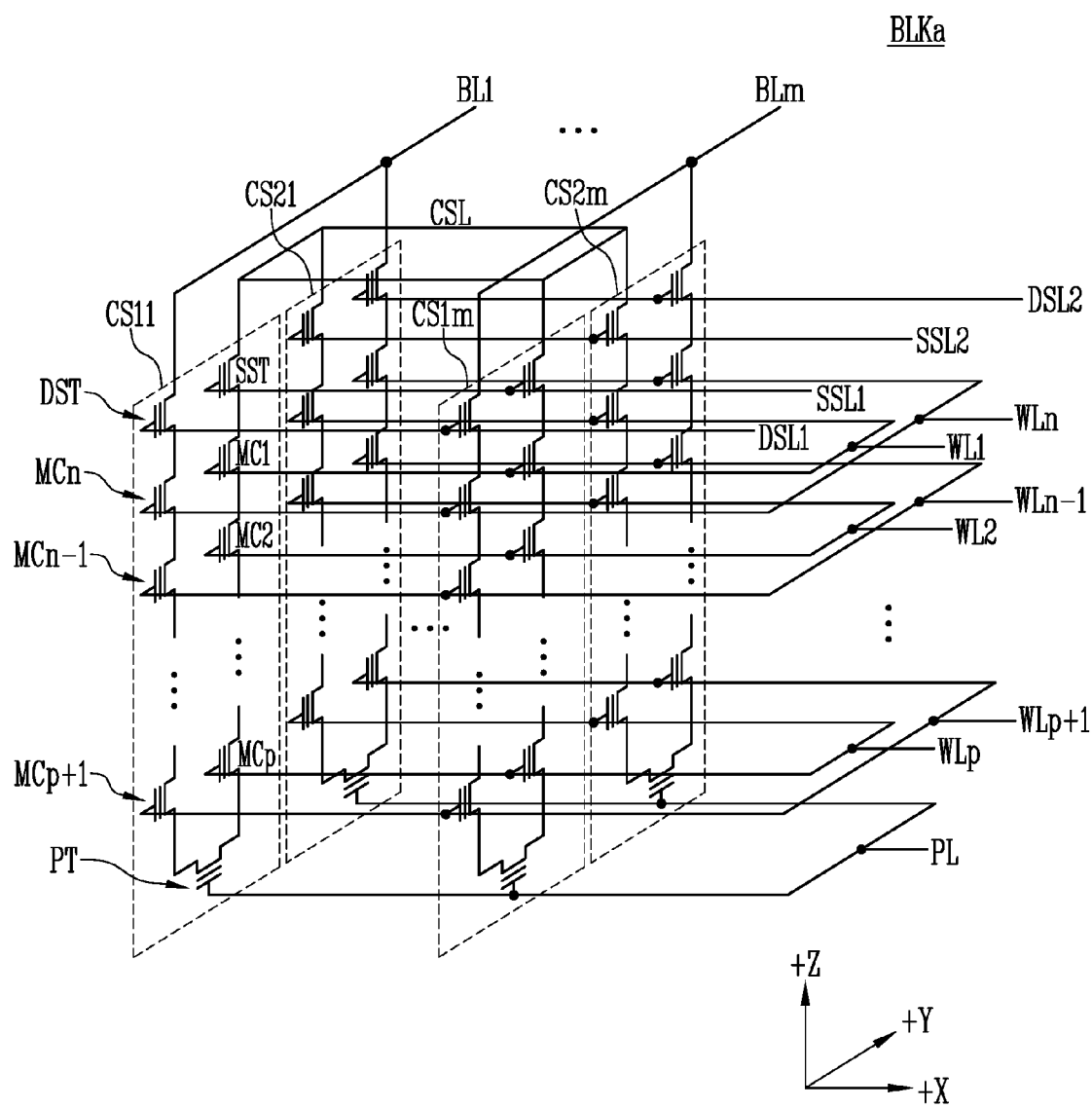
FIG. 4 is a circuit diagram illustrating any one memory block among memory blocks shown in FIG. 3.

FIG. 4 is a circuit diagram illustrating any one memory block BLKa among the memory blocks BLK1 to BLKz shown in FIG. 3.

Referring to FIG. 4, the memory block BLKa may include a plurality of memory cell strings CS11 to CS1$m$ and CS21 to CS2$m$. In an embodiment, each of the plurality of memory cell strings CS11 to CS1$m$ and CS21 to CS2$m$ may be formed in a 'U' shape. In the memory block BLKa, m memory cell strings are arranged in a row direction (i.e., a +X direction). FIG. 4 illustrates two memory cell strings arranged in a column direction (i.e., a +Y direction). However, this is for convenience of description, and it will be understood that three memory cell strings may be arranged in the column direction.

Each of the plurality of memory cell strings CS11 to CS1$m$ and CS21 to CS2$m$ may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each memory cell string. In an embodiment, a pillar for providing at least one of the channel layer, the tunneling insulating layer, the charge storage layer, and the blocking insulating layer may be provided in each memory cell string.

The source select transistor SST of each memory cell string is connected between a common source line CSL and memory cells MC1 to MCp.

In an embodiment, the source select transistors of memory cell strings arranged on the same row are connected to a source select line extending in the row direction, and the source select transistors of memory cell strings arranged on different rows are connected to different source select lines. In FIG. 4, the source select transistors of the memory cell strings CS11 to CS1$m$ on a first row are connected to a first source select line SSL1. The source select transistors of the memory cell strings CS21 to CS2$m$ on a second row are connected to a second source select line SSL2.

In another embodiment, the source select transistors of the memory cell strings CS11 to CS1$m$ and CS21 to CS2$m$ may be commonly connected to one source select line.

The first to nth memory cells MC1 to MCn of each memory cell string are connected between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are connected in series between the source select transistor SST and the pipe transistor PT. The (p+1)th to nth memory cells MCp+1 to MCn are sequentially arranged in the +Z direction, and are connected in series between the pipe transistor PT and the drain select transistor DST. The first to pth memory cells MC1 to MCp and the (p+1)th to nth memory cells MCp+1 to MCn are connected through the pipe transistor PT. Gate electrodes of the first to nth memory cells MC1 to MCn of each memory cell string are connected to first to nth word lines WL1 to WLn, respectively.

A gate of the pipe transistor PT of each memory cell string is connected to a pipe line PL.

The drain select transistor DST of each memory cell string is connected between a corresponding bit line and the memory cells MCp+1 to MCn. Memory cell strings arranged in the row direction are connected to a drain select line extending in the row direction. The drain select transistors of the memory cell strings CS11 to CS1$m$ on the first row are connected to a first drain select line DSL1. The drain select transistors of the memory cell strings CS21 to CS2$m$ on the second row are connected to a second drain select line DSL2.

Memory cell strings arranged in the column direction are connected to a bit line extending in the column direction. In FIG. 4, the memory cell strings CS11 and CS21 on a first column are connected to a first bit line BL1. The memory cell strings CS1$m$ and CS2$m$ on an mth column are connected to an mth bit line BL$m$.

Memory cells connected to the same word line in the memory cell strings arranged in the row direction constitute one page. For example, memory cells connected to the first word line WL1 in the memory cell strings CS11 to CS1$m$ on the first row constitute one page. Memory cells connected to the first word line WL1 in the memory cell strings CS21 to CS2$m$ on the second row constitute another page. As any one of the drain select lines DSL1 and DSL2 is selected, memory cell strings arranged in one row direction may be selected. As any one of the word lines WL1 to WLn is selected, one page may be selected in the selected memory cell strings.

In another embodiment, even bit lines and odd bit lines may be provided instead of the first to mth bit lines BL1 to BLm. In addition, even-numbered memory cell strings among the memory cell strings CS11 to CS1m or CS21 to CS2m arranged in the row direction may be connected to the even bit lines, respectively, and odd-numbered memory cell strings among the memory cell strings CS11 to CS1m or CS21 to CS2m arranged in the row direction may be connected to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKa is improved. On the other hand, the size of the memory block BLKa increases. When the number of dummy memory cells decreases, the size of the memory block BLKa decreases. On the other hand, the reliability of an operation of the memory block BLKa may be deteriorated.

In order to efficiently control the at least one dummy memory cell, the dummy memory cells may have a required threshold voltage. Before or after an erase operation of the memory block BLKa, a program operation may be performed on all or some of the dummy memory cells. When an erase operation is performed after the program operation is performed, the threshold voltage of the dummy memory cells control a voltage applied to the dummy word lines connected to the respective dummy memory cells, so that the dummy memory cells can have the required threshold voltage.

Figure 5:
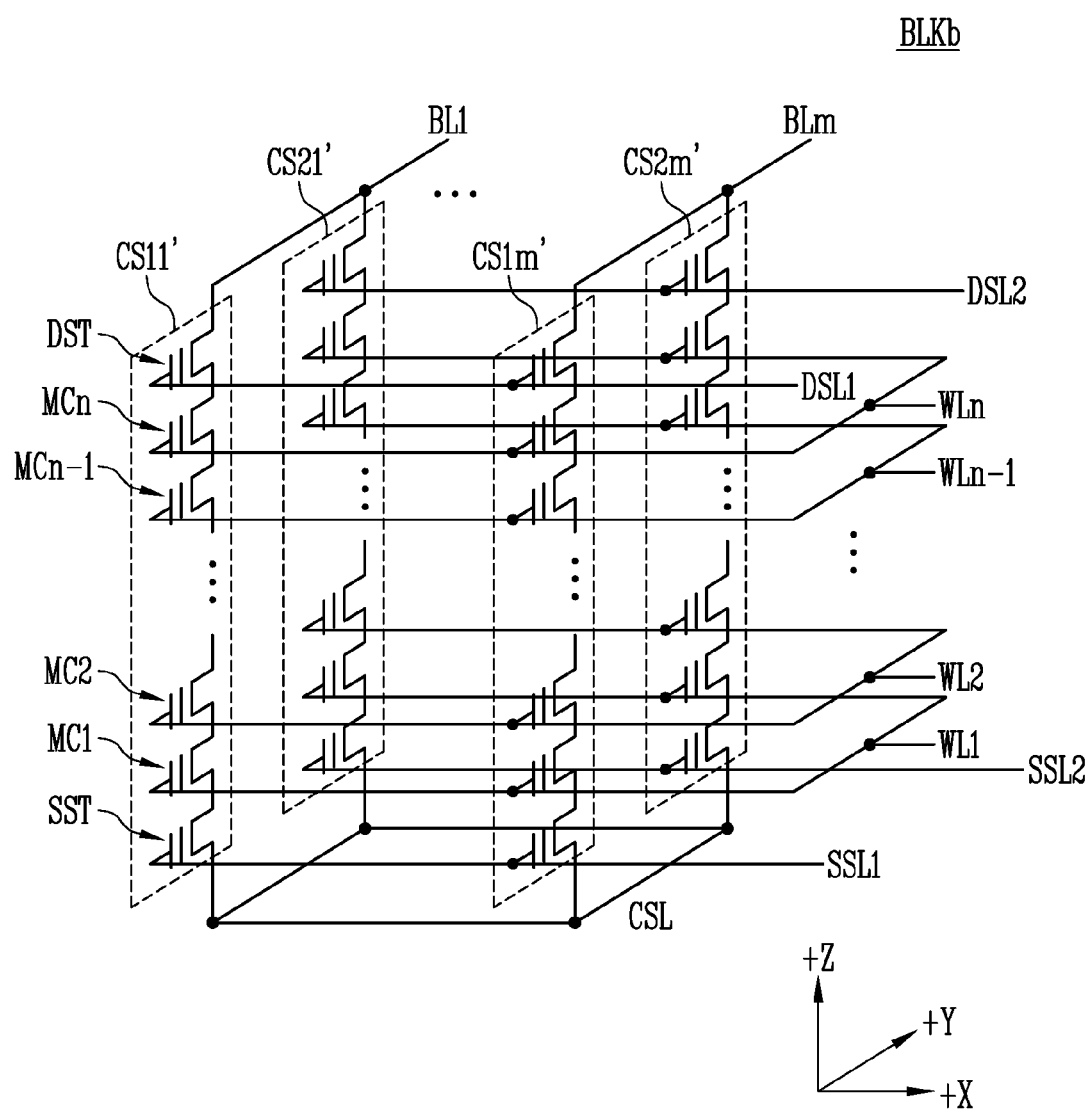
FIG. 5 is a circuit diagram illustrating another embodiment of the one memory block among the memory blocks shown in FIG. 3.

FIG. 5 is a circuit diagram illustrating another embodiment BLKb of the one memory block among the memory blocks BLK1 to BLKz shown in FIG. 3.

Referring to FIG. 5, the memory block BLKb may include a plurality of memory cell strings CS11' to CS1m' and CS21' to CS2m'. Each of the plurality of memory cell strings CS11' to CS1m' and CS21' to CS2m' extends along the +Z direction. Each of the plurality of memory cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLKb.

The source select transistor SST of each memory cell string is connected between a common source line CSL and the memory cells MC1 to MCn. The source select transistors of memory cell strings arranged on the same row are connected to the same source select line. The source select transistors of the memory cell strings CS11' to CS1m' arranged on a first row are connected to a first source select line SSL1. Source select transistors of the memory cell strings CS21' to CS2m' arranged on a second row are connected to a second source select line SSL2. In another embodiment, the source select transistors of the memory cell strings CS11' to CS1m' and CS21' to CS2m' may be commonly connected to one source select line.

The first to nth memory cells MC1 to MCn of each memory cell string are connected in series between the source select transistor SST and the drain select transistor DST. Gate electrodes of the first to nth memory cells MC1 to MCn are connected to first to nth word lines WL1 to WLn, respectively.

The drain select transistor DST of each memory cell string is connected between a corresponding bit line and the memory cells MC1 to MCn. The drain select transistors of memory cell strings arranged in the row direction are connected to a drain select line extending in the row direction. The drain select transistors of the memory cell strings CS11' to CS1m' on the first row are connected to a first drain select line DSL1. The drain select transistors of the memory cell strings CS21' to CS2m' on the second row are connected to a second drain select line DSL2.

Consequently, the memory block BLKb of FIG. 5 has a circuit similar to that of the memory block BLKa of FIG. 4, except that the pipe transistor PT is excluded from each memory cell string in FIG. 5.

In another embodiment, even bit lines and odd bit lines may be provided instead of the first to mth bit lines BL1 to BLm. In addition, even-numbered memory cell strings among the memory cell strings CS11' to CS1m' or CS21' to CS2m' arranged in the row direction may be connected to the even bit lines, respectively, and odd-numbered memory cell strings among the memory cell strings CS11' to CS1m' or CS21' to CS2m' arranged in the row direction may be connected to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKb is improved. On the other hand, the size of the memory block BLKb is increased. When the number of dummy memory cells decreases, the size of the memory block BLKb decreases. On the other hand, the reliability of an operation of the memory block BLKb may be deteriorated.

In order to efficiently control the at least one dummy memory cell, the dummy memory cells may have a required threshold voltage. Before or after an erase operation of the memory block BLKb, a program operation may be performed on all or some of the dummy memory cells. When an erase operation is performed after the program operation is performed, the threshold voltage of the dummy memory cells controls a voltage applied to the dummy word lines connected to the respective dummy memory cells, so that the dummy memory cells can have the required threshold voltage.

Figure 6:
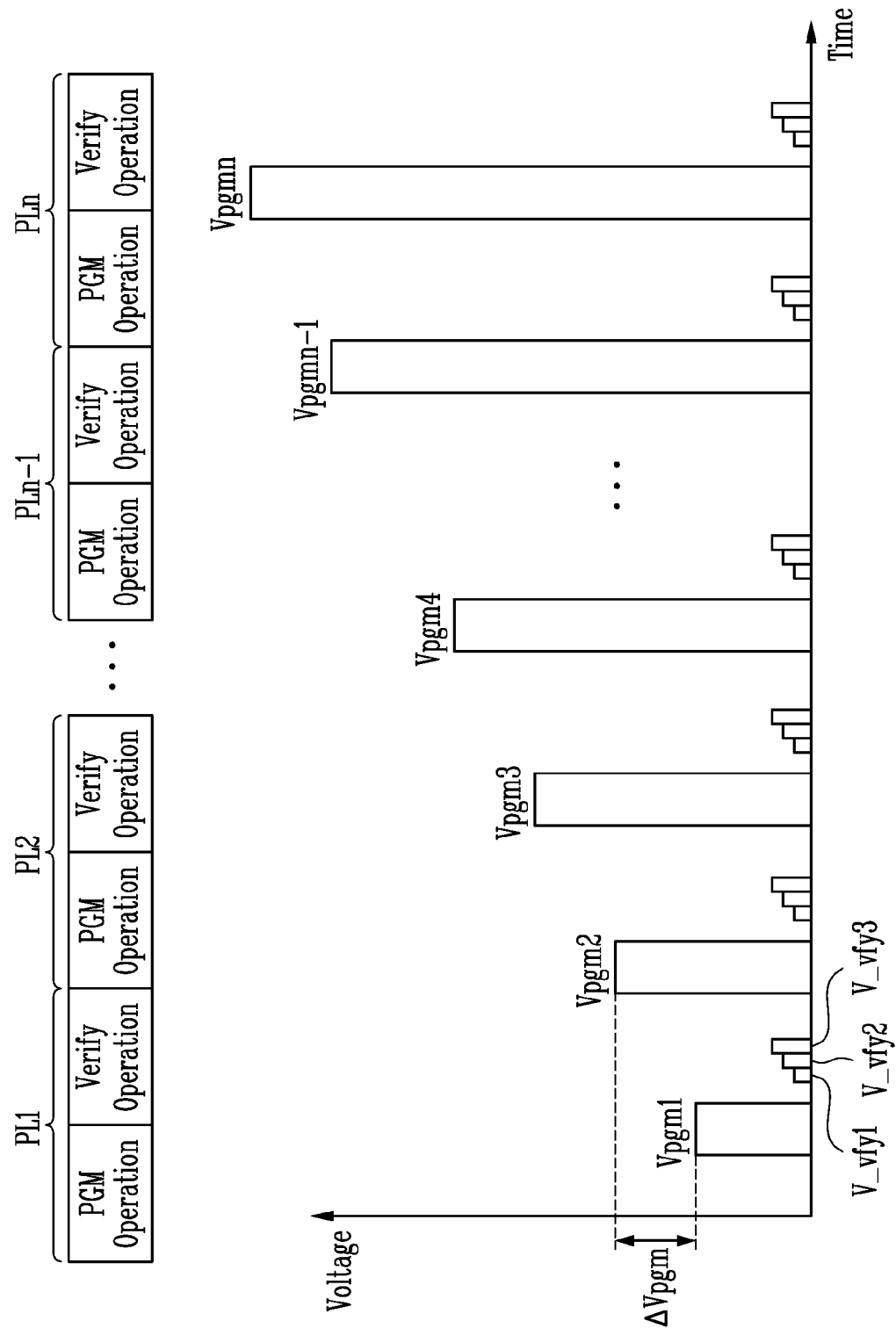
FIG. 6 is a diagram illustrating a program operation of the memory device shown in FIG. 2.

FIG. 6 is a diagram illustrating a program operation of the memory device shown in FIG. 2.

In FIG. 6, for convenience of description, it is assumed that each of a plurality of memory cells is a Multi-Level Cell (MLC) storing 2-bit data. However, the scope of the present disclosure is not limited thereto, and each of the plurality of memory cells may be a Triple Level Cell (TLC) storing 3-bit data or a Quadruple Level Cell (QLC) storing 4-bit data.

The program operation of the memory device 100 may include a plurality of program loops PL1 to PLn. That is, the memory device 100 may program selected memory cells to have a threshold voltage corresponding to any one state among a plurality of program states P1, P2, and P3 by performing the plurality of program loops PL1 to PLn.

Each of the plurality of program loops PL1 to PLn may include a program voltage apply operation PGM Operation of applying a program voltage and a verify operation Verify Operation of determining whether memory cells have been programmed by applying verify voltages.

For example, when a first program loop PL1 is performed, verify voltages V_vfy1 to V_vfy3 may be sequentially applied so as to verify a program state of a plurality of memory cells after a first program pulse Vpgm1 is applied. Verification on memory cells of which target program state is a first program state P1 may be performed by a verify voltage V_vfy1 corresponding to the first program state P1, verification on memory cells of which target program state is a second program state P2 may be performed by a verify voltage V_vfy2 corresponding to the second program state P2, and verification on memory cells of which target program state is a third program state P3 may be performed by a verify voltage V_vfy3 corresponding to the third program state P3.

It may be determined that memory cells verify-passed by each of the verify voltages V_vfy1 to V_vfy3 have a target program state. Subsequently, the memory cells may be program-inhibited in a second program loop PL2. A second program pulse Vpgm2 higher by a unit voltage ΔVpgm than the first program pulse Vpgm1 is applied so as to program the other memory cells except the memory cells program-inhibited in the second program loop PL2. Subsequently, a verify operation is performed identically to that of the first program loop PL1. For example, the term "verify pass" indicates that a memory cell is read as an off-cell by a corresponding verify voltage.

As described above, when the memory device 100 programs an MLC storing 2-bit data, the memory device 100 may verify memory cells having program states as target program states by using the verify voltages V_vfy1 to V_vfy3.

In the verify operation, a verify voltage may be applied to a selected word line as a word line to which the selected memory cells are connected, and the page buffer may determine whether memory cells have verify-passed, based on a current or voltage flowing through bit lines respectively connected to the selected memory cells.

For example, the memory device 100 may store a state of a memory cell according to a voltage of a bit line. The state of the memory cell may be a state corresponding to any one of verify pass or verify fail. When a threshold voltage of the memory cell is higher than the verify voltage applied to the selected word line, the memory cell may be read as an off-cell. The memory cell read as the off-cell may correspond to a verify pass state. On the contrary, when the threshold voltage of the memory cell is lower than the verify voltage applied to the selected word line, the memory cell may be read as an on-cell. The memory cell read as the on-cell may correspond to a verify fail state.

Figure 7:
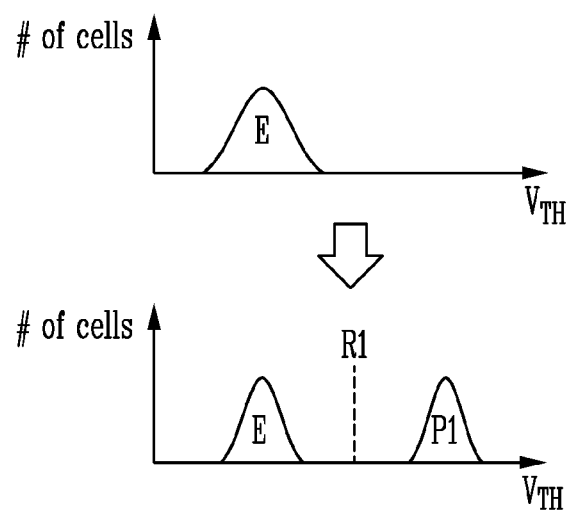
FIG. 7 is a diagram illustrating a threshold voltage distribution of single level cells.

FIG. 7 is a diagram illustrating a threshold voltage distribution of single level cells.

Referring to FIG. 7, the horizontal axis represents threshold voltage of memory cells, and the vertical axis represents number of memory cells.

The memory device 100 may perform a program operation in units of word lines. A plurality of memory cells connected to one word line may constitute one physical page. The physical page may be a unit of a program or read operation.

The memory device 100 may program memory cells connected to a selected word line among a plurality of word lines according to data to be stored.

Selected memory cells as the memory cells connected to the selected word line may have a threshold voltage distribution corresponding to an erase state E as shown in a graph illustrated at an upper side before the program operation is performed.

When a memory cell stores data corresponding to one bit, the memory cell may be programmed to have a threshold voltage corresponding to any one of the erase state E and a first program state P1.

The erase state E may correspond to data '1,' and the first program state P1 may correspond to data '0.' However, the data corresponding to the first program state P1 is merely illustrative. The erase state E may correspond to the data '0,' and the first program state P1 may correspond to the data '1.'

When the program operation is ended, the selected memory cells may have a threshold voltage corresponding to any one of the erase state E and the first program state P1 as shown in a graph illustrated at a lower side. The memory device 100 performs a read operation using a first read voltage R1 between the erase state E and the first program state P1, so that data stored in the selected memory cells can be read.

Figure 8:
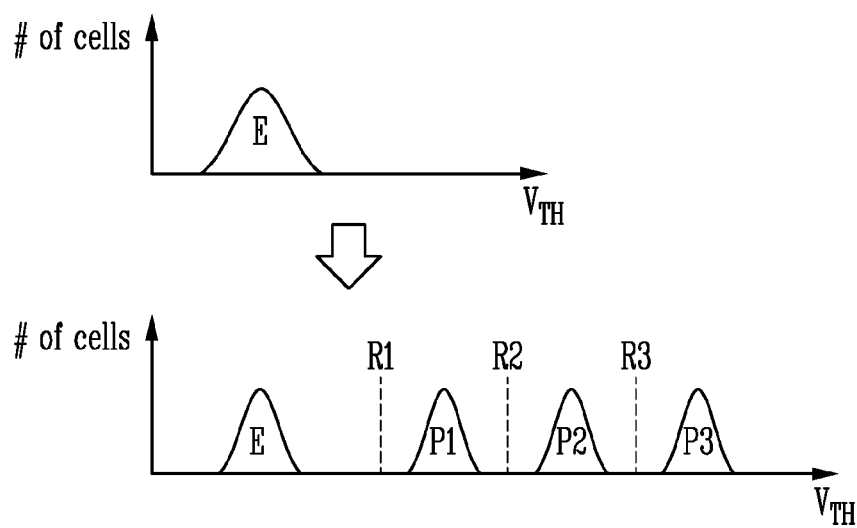
FIG. 8 is a diagram illustrating a threshold voltage distribution of multi-level cells.

FIG. 8 is a diagram illustrating a threshold voltage distribution of multi-level cells.

Referring to FIG. 8, the horizontal axis represents threshold voltage of memory cells, and the vertical axis represents number of memory cells.

Selected memory cells as the memory cells connected to the selected word line may have a threshold voltage distribution corresponding to an erase state E as shown in a graph illustrated at an upper side before the program operation is performed.

When a memory cell stores data corresponding to two bits, the memory cell may be programmed to have a threshold voltage corresponding to any one of the erase state E, a first program state P1, a second program state P2, and a third program state P3. In an embodiment, the third program state P3 may be the highest program state.

The erase state E may correspond to data '11,' the first program state P1 may correspond to data '10,' the second program data P2 may correspond to data '00,' and the third program state P3 may correspond to state '01.' However, data corresponding to each program state is merely illustrative, and may be variously changed.

When the program operation is ended, the selected memory cells may have a threshold voltage corresponding to any one of the erase state E, the first program state P1, the second program state P2, and the third program state P3 as shown in a graph illustrated at a lower side. The memory device 100 performs a read operation using first to third read voltages R1 to R3, so that data stored in the selected memory cells can be read.

The first read voltage R1 may be a read voltage for distinguishing the erase state E and the first program state P1 from each other, the second read voltage R2 may be a read voltage for distinguishing the first program state P1 and the second program state P2 from each other, and the third read voltage R3 may be a read voltage for distinguishing the second program state P2 and the third program state P3 from each other.

Figure 9:
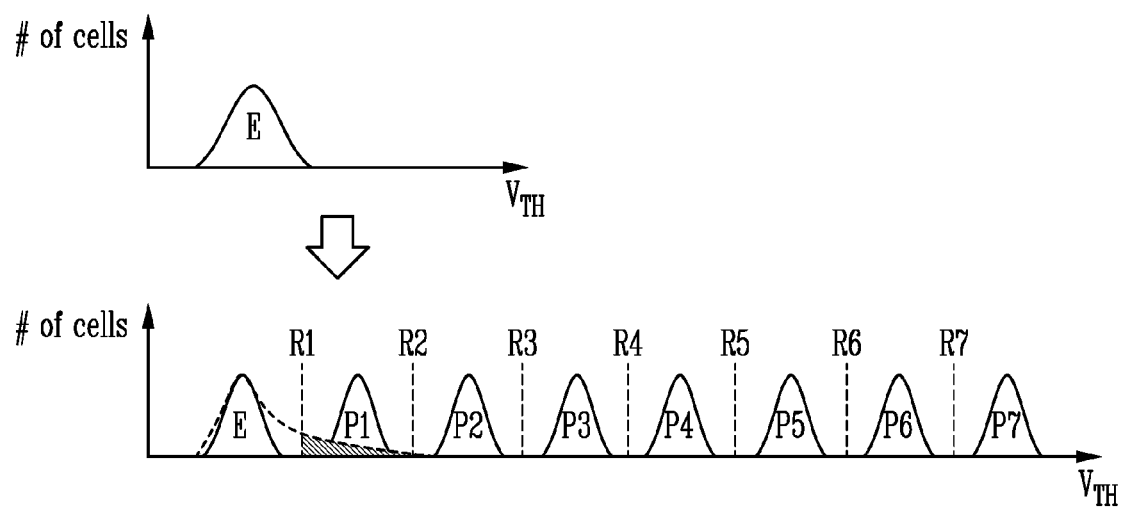
FIG. 9 is a diagram illustrating a threshold voltage distribution of triple level cells.

FIG. 9 is a diagram illustrating a threshold voltage distribution of triple level cells.

Referring to FIG. 9, the horizontal axis represents a threshold voltage of memory cells, and the vertical axis represents number of memory cells.

Selected memory cells as the memory cells connected to the selected word line may have a threshold voltage distribution corresponding to an erase state E as shown in a graph illustrated at an upper side before the program operation is performed.

When a memory cell stores data corresponding to three bits, the memory cell may be programmed to have a threshold voltage corresponding to any one of the erase state E, a first program state P1, a second program state P2, a third program state P3, a fourth program state P4, a fifth program state P5, a sixth program state P6, and a seventh program state P7. In an embodiment, the program state P7 may be the highest program state.

The erase state E may correspond to data '111,' the first program state P1 may correspond to data '110,' the second program state P2 may correspond to data '101,' the third program state P3 may correspond to data '100,' the fourth program state P4 may correspond to data '011,' the fifth program state P5 may correspond to data '101,' the sixth program state P6 may correspond to data '001,' and the seventh program state P7 may correspond to data '000.' However, data corresponding to each program state is merely illustrative, and may be variously changed.

When the program operation is ended, the selected memory cells may have a threshold voltage corresponding to any one of the erase state E, the first program state P1, the second program state P2, the third program state P3, the fourth program state P4, the fifth program state P5, the sixth program state P6, and the seventh program state P7 as shown in a graph illustrated at a lower side. The memory device 100 performs a read operation using first to seventh read voltages R1 to R7, so that data stored in the selected memory cells can be read.

The first read voltage R1 may be a read voltage for distinguishing the erase state E and the first program state P1 from each other, the second read voltage R2 may be a read voltage for distinguishing the first program state P1 and the second program state P2 from each other, the third read voltage R3 may be a read voltage for distinguishing the second program state P2 and the third program state P3 from each other, the fourth read voltage R4 may be a read voltage for distinguishing the third program state P3 and the fourth program state P4 from each other, the fifth read voltage R5 may be a read voltage for distinguishing the fourth program state P4 and the fifth program state P5 from each other, the sixth read voltage R6 may be a read voltage for distinguishing the fifth program state P5 and the sixth program state P6 from each other, and the seventh read voltage R7 may be a read voltage for distinguishing the sixth program state P6 and the seventh program state P7 from each other.

Meanwhile, a plurality of program loops may have influence on a threshold voltage distribution of memory cells programmed to the erase state. Accordingly, a threshold voltage of the memory cells programmed to the erase state, such as a distribution indicated by a dotted line, may be changed to an abnormal threshold voltage distribution. Although memory cells in a slashed area have been programmed to the erase state, the memory cells may be read as memory cells having the first program state P1 in a read operation. This abnormal threshold voltage distribution may cause error correction fail in the read operation. However, normally a program operation verifies a program state of memory cells programmed to any one program state, but does not verify an erase state of memory cells programmed to an erase state.

Thus, in accordance with the embodiment of the present disclosure, an erase state of memory cells programmed to the erase state are verified during the program operation, so that read fail caused by the memory cells in the erase state can be prevented or mitigated. An operation of verifying an erase state of memory cells programmed to the erase state will be described below with reference to FIGS. 10 to 13.

Figure 10:
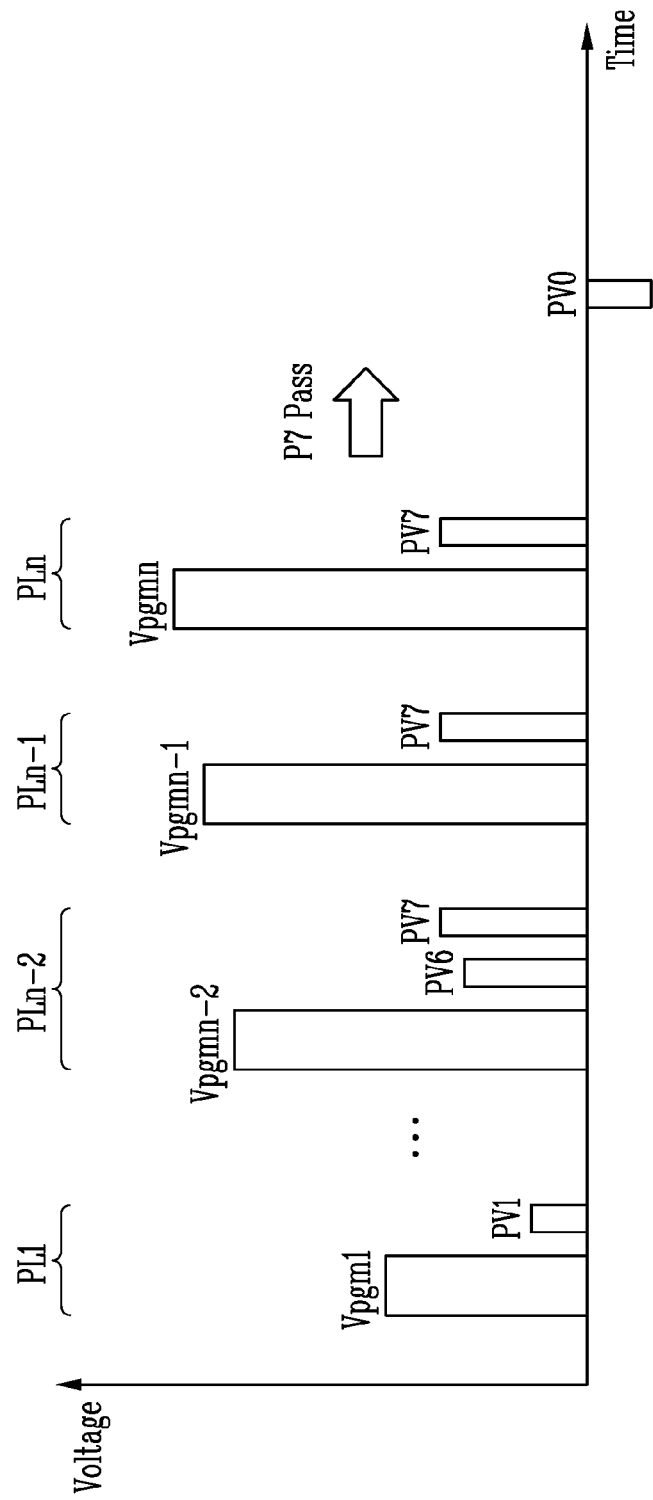
FIG. 10 is a diagram illustrating an example of an operation of the memory device in accordance with an embodiment of the present disclosure.

FIG. 10 is a diagram illustrating an example of an operation of the memory device in accordance with an embodiment of the present disclosure.

In FIG. 10, for convenience of description, it is assumed that each of a plurality of memory cells is a triple level cell storing 3-bit data. However, the scope of the present disclosure is not limited thereto, each of the plurality of memory cells may be a multi-level cell storing 2-bit data or a quad level cell storing 4-bit data.

Referring to FIG. 10, the memory device 100 may perform a plurality of program loops PL1 to PLn. For example, the memory device 100 may apply a program voltage to selected memory cells, and verify a program state of memory cells programmed to any one program state. The memory device 100 may verify a program state of memory cells by applying verify voltages PV1 to PV7 corresponding to each program state to a selected word line.

In an embodiment, the memory device 100 may verify an erase state of memory cells programmed to the erase state E among the selected memory cells, after a verify operation on a plurality of program states PV1 to PV7 passes according to the plurality of program loops PL1 to PLn.

For example, a verify operation on a program state of memory cells programmed to the seventh program state P7 may pass according to the plurality of program loops PL1 to PLn performed sequentially. Subsequently, the memory device 100 may verify the erase state of the memory cells programmed to the erase state. The memory device 100 may verify the erase state of the memory cells programmed to the erase state by applying a verify voltage PV0 corresponding to the erase state to the selected word line. The verify voltage PV0 corresponding to the erase state may be lower than the verify voltages PV1 to PV7 corresponding to each program state.

Also, when a threshold voltage of the memory cells programmed to the erase state is lower than the verify voltage PV0 corresponding to the erase state, the memory device 100 may determine that a verify operation on the erase state has passed. The memory cells programmed to the erase state may correspond to a verify pass state. When it is determined that the verify operation on the erase state has passed, the memory device 100 may end the program operation.

Alternatively, when the threshold voltage of the memory cells programmed to the erase state is higher than the verify voltage PV0 corresponding to the erase state, the memory device 100 may determine that the verify operation on the erase state has failed. The memory cells programmed to the erase state may correspond to a verify fail state. In an embodiment, when it is determined that the verify operation on the erase state has failed, the memory device 100 may program data in other memory cells instead of the selected memory cells.

Figure 11:
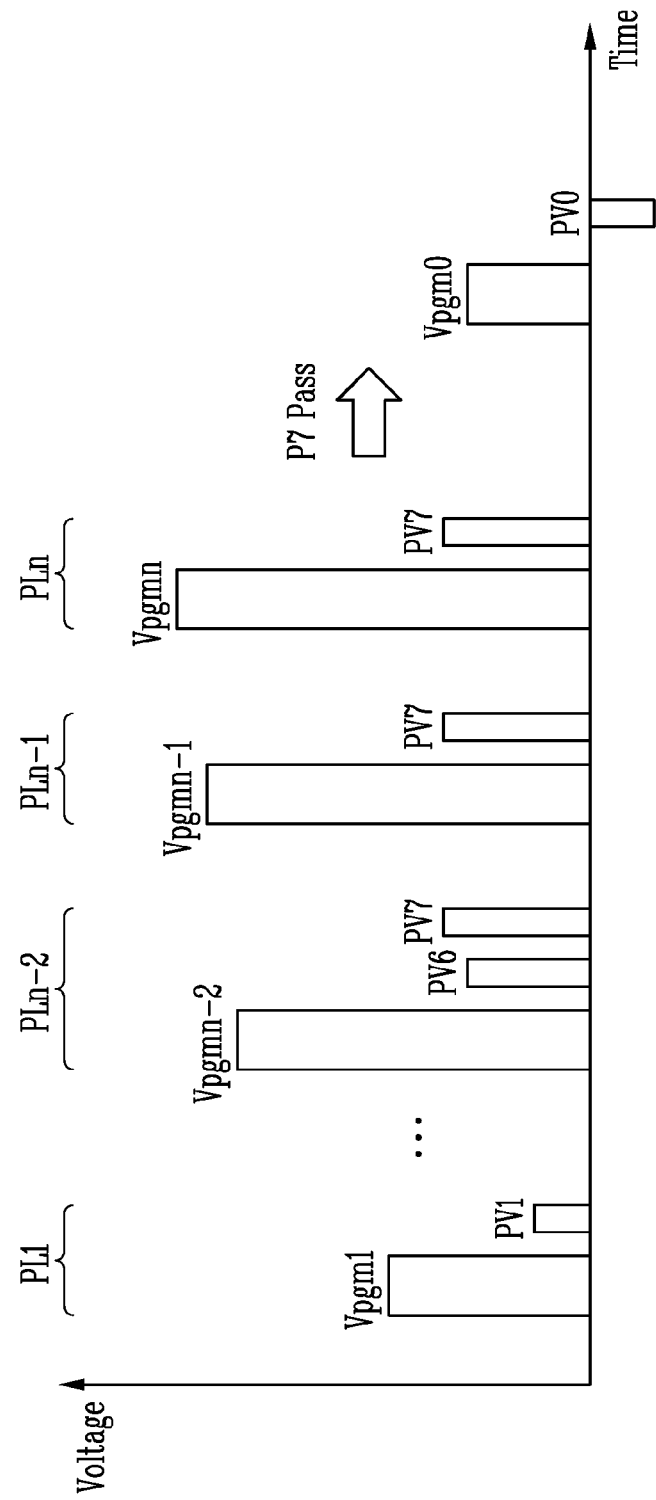
FIG. 11 is a diagram illustrating another example of the operation of the memory device in accordance with an embodiment of the present disclosure.

FIG. 11 is a diagram illustrating another example of the operation of the memory device in accordance with an embodiment of the present disclosure.

In FIG. 11, for convenience of description, it is assumed that each of a plurality of memory cells is a triple level cell storing 3-bit data. However, the scope of the present disclosure is not limited thereto, each of the plurality of memory cells may be a multi-level cell storing 2-bit data or a quad level cell storing 4-bit data.

Referring to FIG. 11, the memory device 100 may perform a plurality of program loops PL1 to PLn. For example, the memory device 100 may apply a program voltage to selected memory cells, and verify a program state of memory cells programmed to any one program state. The memory device 100 may verify a program state of memory cells by applying verify voltages PV1 to PV7 corresponding to each program state to a selected word line.

In an embodiment, the memory device 100 may verify an erase state of memory cells programmed to the erase state E among the selected memory cells, after a verify operation on a plurality of program states PV1 to PV7 passes according to the plurality of program loops PL1 to PLn.

For example, a verify operation on a program state of memory cells programmed to the seventh program state P7 may pass according to the plurality of program loops PL1 to PLn performed sequentially. Subsequently, the memory device 100 may apply a predetermined lowest program voltage Vpgm0. The lowest program voltage Vpgm0 may be a lowest program voltage which may be applied to memory cells according to the design of the memory device 100. The lowest program voltage Vpgm0 may be set in a process of designing the memory device 100. For example, the lowest program voltage Vpgm0 may be lower than a first program voltage Vpgm1. Thus, although the lowest program voltage Vpgm0 is applied to the selected memory cells, the program state or erase state of memory cells can be maintained.

Also, after the lowest program voltage Vpgm0 is applied to the selected memory cells, the memory device 100 may verify an erase state of memory cells programmed to the erase state. The memory device 100 may verify the erase state of the memory cells programmed to the erase state by applying a verify voltage PV0 corresponding to the erase state to the selected word line. The verify voltage PV0 corresponding to the erase state may be lower than the verify voltages PV1 to PV7 corresponding to each program state. Also, the verify voltage PV0 corresponding to the erase state may include a negative verify voltage.

Also, when a threshold voltage of the memory cells programmed to the erase state is lower than the verify voltage PV0 corresponding to the erase state, the memory device 100 may determine that a verify operation on the erase state has passed. The memory cells programmed to the erase state may correspond to a verify pass state. When it is determined that the verify operation on the erase state has passed, the memory device 100 may end the program operation.

Alternatively, when the threshold voltage of the memory cells programmed to the erase state is higher than the verify voltage PV0 corresponding to the erase state, the memory device 100 may determine that the verify operation on the erase state has failed. The memory cells programmed to the erase state may correspond to a verify fail state. In an embodiment, when it is determined that the verify operation on the erase state has failed, the memory device 100 may program data in other memory cells instead of the selected memory cells.

Figure 12:
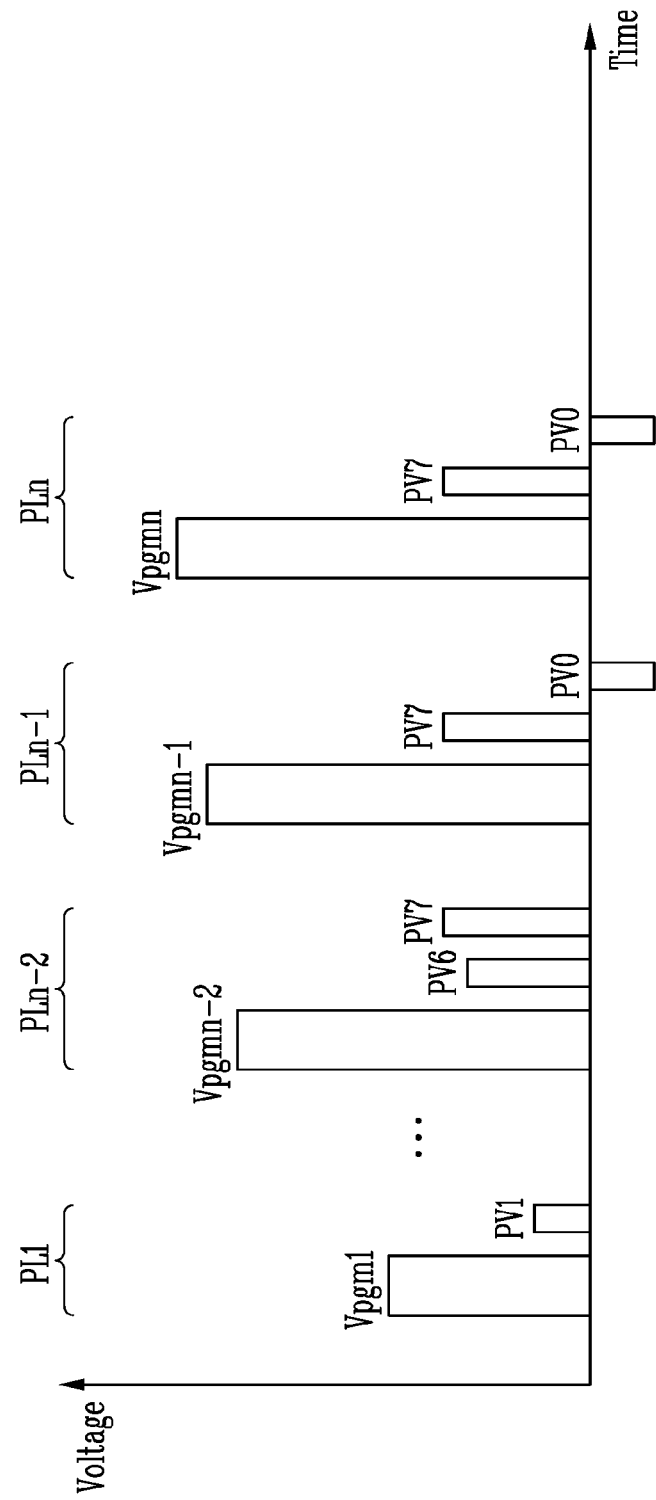
FIG. 12 is a diagram illustrating still another example of the operation of the memory device in accordance with an embodiment of the present disclosure.
Figure 13:
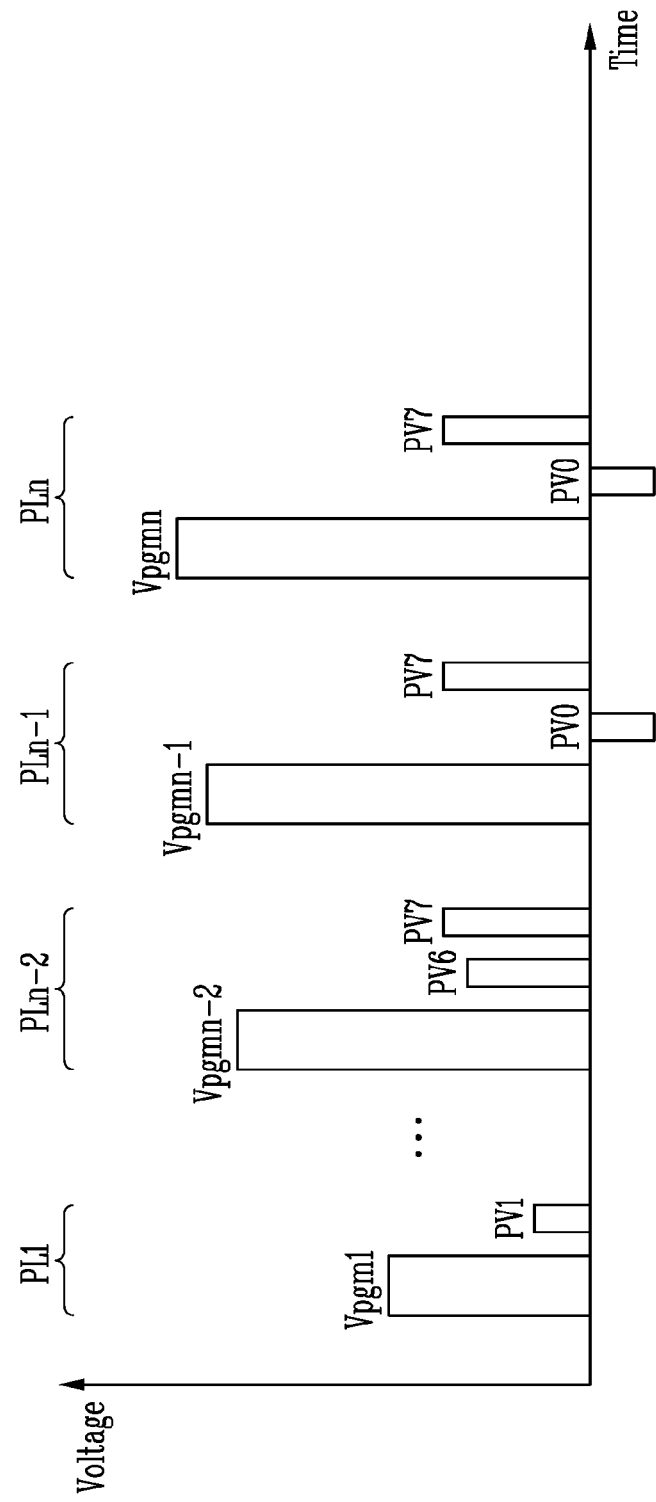
FIG. 13 is a diagram illustrating still another example of the operation of the memory device in accordance with an embodiment of the present disclosure.

FIG. 12 is a diagram illustrating still another example of the operation of the memory device in accordance with an embodiment of the present disclosure. FIG. 13 is a diagram illustrating still another example of the operation of the memory device in accordance with an embodiment of the present disclosure.

In FIGS. 12 and 13, for convenience of description, it is assumed that each of a plurality of memory cells is a triple level cell storing 3-bit data. However, the scope of the present disclosure is not limited thereto, each of the plurality of memory cells may be a multi-level cell storing 2-bit data or a quad level cell storing 4-bit data.

Referring to FIG. 12, the memory device 100 may perform a plurality of program loops PL1 to PLn. For example, the memory device 100 may apply a program voltage to selected memory cells, and verify a program state of memory cells programmed to any one program state. The memory device 100 may verify a program state of memory cells by applying verify voltages PV1 to PV7 corresponding to each program state to a selected word line.

In an embodiment, the memory device 100 may verify an erase state of memory cells programmed to the erase state E in a verify operation included in at least one program loop corresponding to a specific program state among the plurality of program loops PL1 to PLn.

The specific program state may include a program state having a higher threshold voltage than the other program states among a plurality of program states. For example, the specific program state may be the seventh program state P7. (PLn−1)th and (PLn)th program loops PLn−1 and PLn may be program loops corresponding to the seventh program state.

The memory device 100 may verify the erase state of the memory cells programmed to the erase state in a verify operation included in the (PLn−1)th and (PLn)th program loops PLn−1 and PLn. For example, the memory device 100 may verify a program state of memory cells programmed to the seventh program state in the verify operation included in the (PLn−1)th and (PLn)th program loops PLn−1 and PLn. The memory device 100 may verify the program state of the memory cells programmed to the seventh program state by applying a verify voltage PV7 corresponding to the seventh program state. Subsequently, the memory device 100 may verify the erase state of the memory cells programmed to the erase state in the verify operation included in the (PLn−1)th and (PLn)th program loops PLn−1 and PLn. The memory device 100 may verify the erase state of the memory cells programmed to the erase state by applying a verify voltage PV0 corresponding to the erase state. The verify voltage PV0 corresponding to the erase state may be lower than the verify voltages PV1 to PV7 corresponding to each program state. Also, the verify voltage PV0 corresponding to the erase state may include a negative verify voltage.

Also, when a threshold voltage of the memory cells programmed to the erase state is lower than the verify voltage PV0 corresponding to the erase state, the memory device 100 may determine that a verify operation on the erase state has passed. The memory cells programmed to the erase state may correspond to a verify pass state. When it is determined that the verify operation on the erase state has passed, the memory device 100 may end the program operation.

Alternatively, when the threshold voltage of the memory cells programmed to the erase state is higher than the verify voltage PV0 corresponding to the erase state, the memory device 100 may determine that the verify operation on the erase state has failed. The memory cells programmed to the erase state may correspond to a verify fail state. In an embodiment, when it is determined that the verify operation on the erase state has failed, the memory device 100 may program data in other memory cells instead of the selected memory cells.

Meanwhile, the operation shown in FIG. 13 may have a different order in which verify voltages are applied, as compared with the operation shown in FIG. 12.

Referring to FIG. 13, the memory device 100 may verify the erase state of the memory cells programmed to the erase state by applying the verify voltage PV0 corresponding to the erase state in the verify operation included in the (PLn−1)th and (PLn)th program loops PLn−1 and PLn. Subsequently, the memory device 100 may verify the program state of the memory cells programmed to the seventh program state by applying the verify voltage PV7 corresponding to the seventh program state in the verify operation included in the (PLn−1)th and (PLn)th program loops PLn−1 and PLn.

Figure 14:
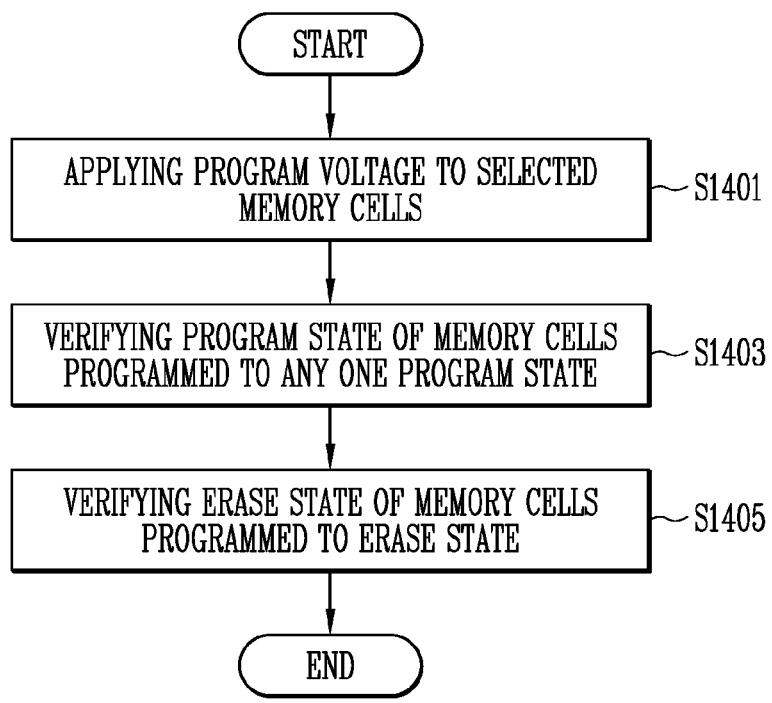
FIG. 14 is a flowchart illustrating an operating method of a memory device in accordance with an embodiment of the present disclosure.

FIG. 14 is a flowchart illustrating an operating method of a memory device in accordance with an embodiment of the present disclosure.

The operating method shown in FIG. 14 may be performed by, for example, the memory device 100 shown in FIG. 1.

Referring to FIG. 14, in step S1401, the memory device 100 may apply a program voltage to selected memory cells among a plurality of memory cells.

In step S1403, the memory device 100 may verify a program state of memory cells programmed to any one program state among the selected memory cells.

In step S1405, the memory device 100 may verify an erase state of memory cells programmed to an erase state among the selected memory cells.

Figure 15:
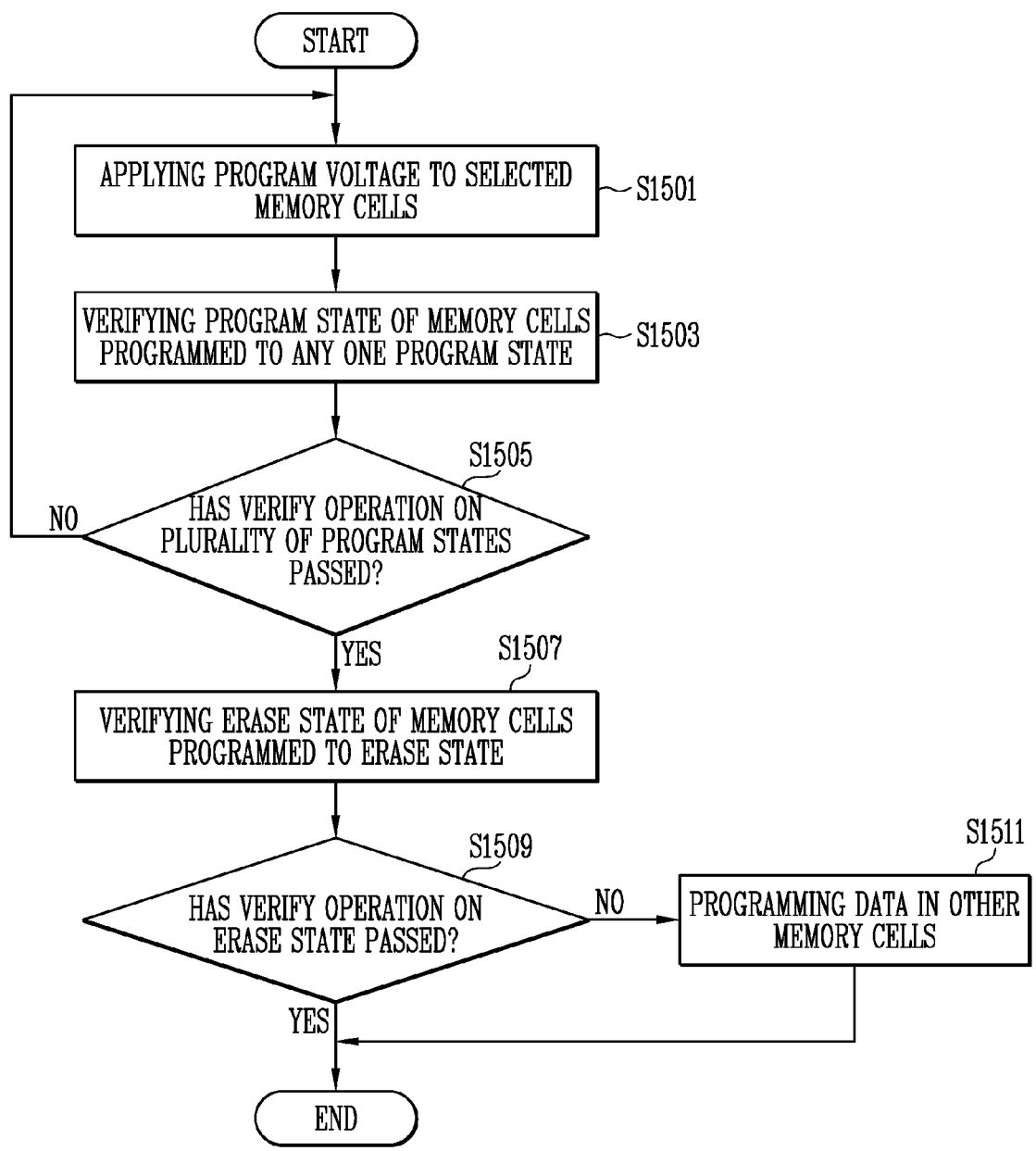
FIG. 15 is a flowchart illustrating an operating method of a memory device in accordance with an additional embodiment of the present disclosure.

FIG. 15 is a flowchart illustrating an operating method of a memory device in accordance with an additional embodiment of the present disclosure.

The operating method shown in FIG. 15 may be performed by, for example, the memory device 100 shown in FIG. 1.

The operating method shown in FIG. 15 may be a flowchart obtained by materializing the operating method shown in FIG. 14.

Referring to FIG. 15, in step S1501, the memory device 100 may apply a program voltage to selected memory cells among a plurality of memory cells.

In step S1503, the memory device 100 may verify a program state of memory cells programmed to any one program state among the selected memory cells. For example, the memory device 100 may verify a program state of memory cells programmed to any one program state by applying a first verify voltage to a selected word line connected to the selected memory cells.

In step S1505, the memory device 100 may determine whether a verify operation on a plurality of program states has passed. When the verify operation on the plurality of program states fails, based on the determination result in the step S1505, the memory device 100 may again perform the steps S1501 and S1503. That is, the memory device 100 may repeatedly perform a program voltage apply operation and a verify operation until the verify operation on the plurality of program states passes.

When the verify operation on the plurality of program states passes, based on the determination result in the step S1505, the memory device 100 may perform step S1507. In the step S1507, the memory device 100 may verify an erase state of memory cells programmed to an erase state among the selected memory cells.

For example, after a predetermined lowest program voltage is applied to the selected memory cells, the memory device 100 may verify the erase state of the memory cells programmed to the erase state. The memory device 100 may verify the erase state of the memory cells programmed to the erase state by applying a second verify voltage to the selected word line. In an embodiment, the second verify voltage is a voltage lower than the first verify voltage, and include a negative verify voltage.

In step S1509, the memory device 100 may determine whether a verify operation on the erase state has passed. For example, when a threshold voltage of the memory cells programmed to the erase state is higher than the second verify voltage, the memory device 100 may determine that the verify operation on the erase state has failed. Alternatively, when the threshold voltage of the memory cells programmed to the erase state is lower than the second verify voltage, the memory device 100 may determine that the verify operation on the erase state has passed.

When the verify operation on the erase state passes, based on the determination result in the step S1509, a program operation on the selected memory cells may be ended.

When it is determined that the verify operation on the erase state has failed, based on the determination result in the step S1509, the memory device may perform step S1511. In the step S1511, the memory device 100 may program data in other memory cells except the selected memory cells among the plurality of memory cells.

Figure 16:
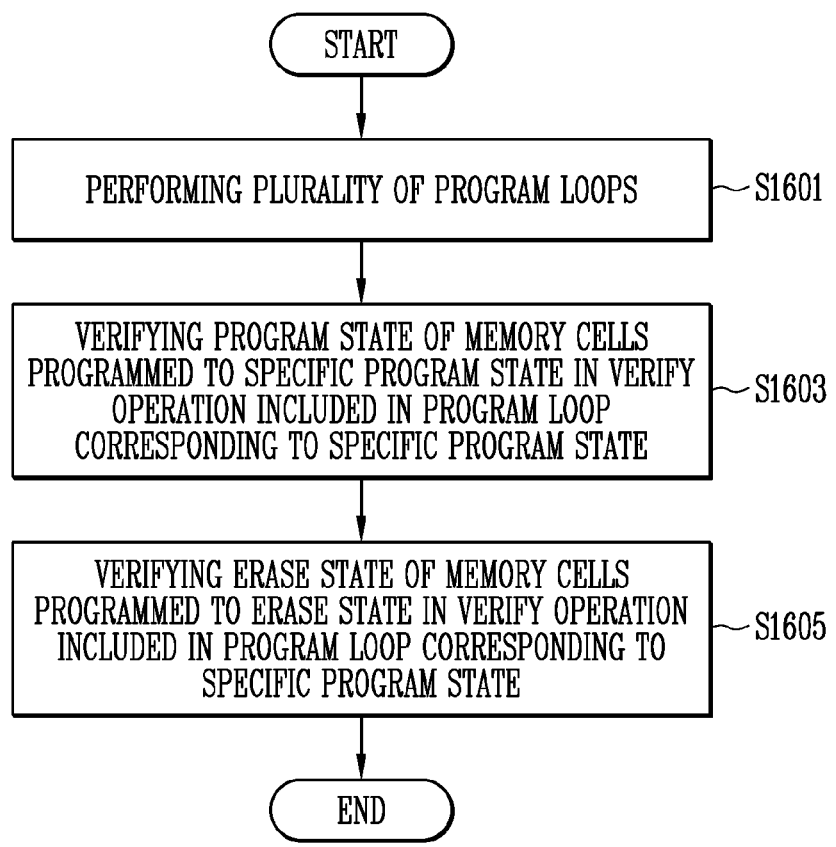
FIG. 16 is a flowchart illustrating an operating method of a memory device in accordance with an embodiment of the present disclosure.

FIG. 16 is a flowchart illustrating an operating method of a memory device in accordance with an embodiment of the present disclosure.

The operating method shown in FIG. 16 may be performed by, for example, the memory device 100 shown in FIG. 1.

Referring to FIG. 16, in step S1601, the memory device 100 may perform a plurality of program loops. Each of the plurality of program loops may include a program voltage apply operation of applying a program voltage to selected memory cells and a verify operation of determining at least one of a program state and an erase state of the selected memory cells.

In step S1603, the memory device 100 may verify a program state of memory cells programmed to a specific program state in a verify operation included in at least one program loops corresponding to the specific program state among the plurality of program loops.

In an embodiment, the specific program state may include a program state having a higher threshold voltage than the other program states among a plurality of program states.

In step S1605, the memory device 100 may verify an erase state of memory cells programmed to an erase state in the verify operation included in at least one program loops corresponding to the specific program state.

Figure 17:
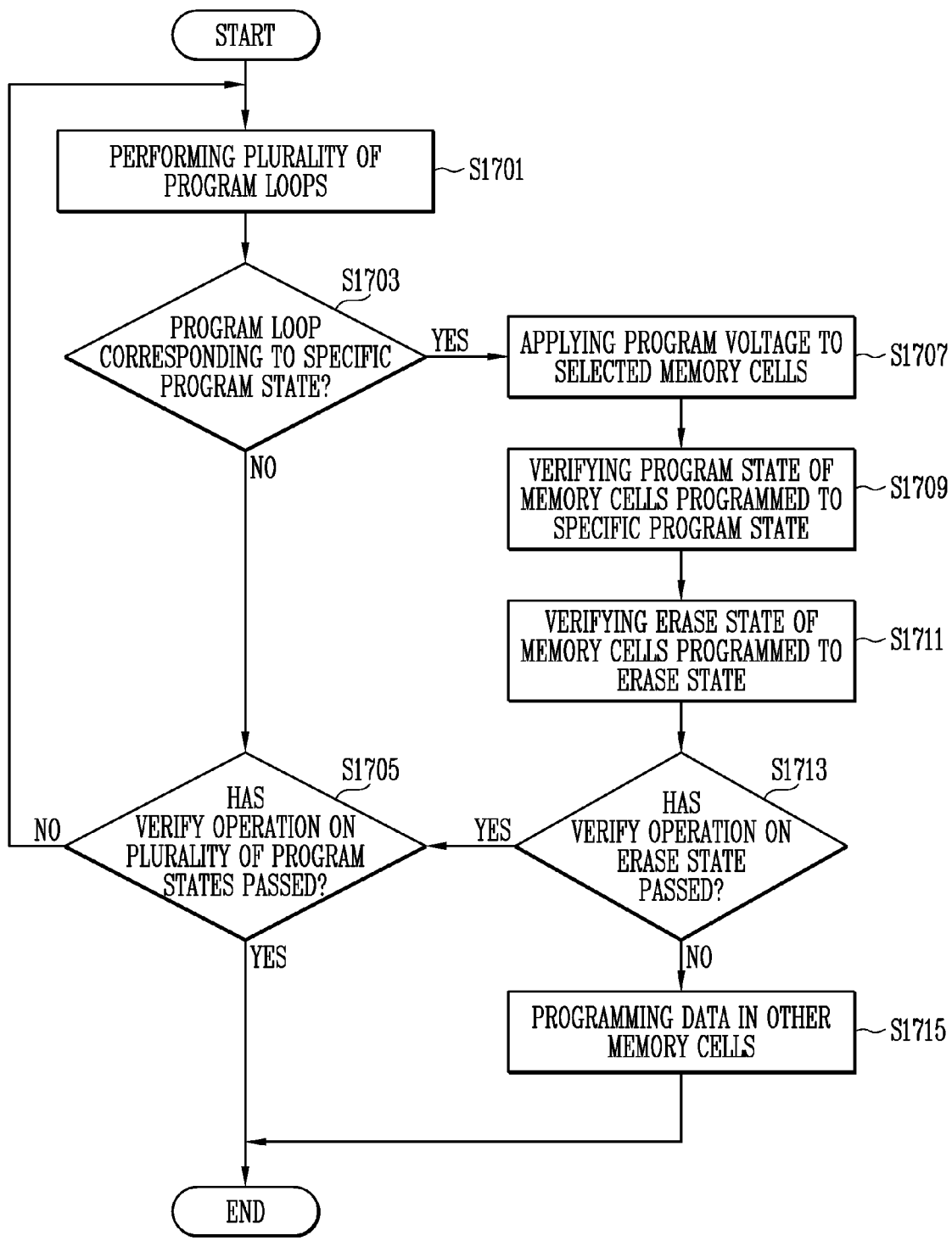
FIG. 17 is a flowchart illustrating an operating method of a memory device in accordance with an embodiment of the present disclosure.

FIG. 17 is a flowchart illustrating an operating method of a memory device in accordance with an embodiment of the present disclosure.

The operating method shown in FIG. 17 may be performed by, for example, the memory device 100 shown in FIG. 1.

The operating method shown in FIG. 17 may be a flowchart obtained by materializing the operating method shown in FIG. 16.

Referring to FIG. 17, in step S1701, the memory device 100 may perform a plurality of program loops.

In step S1703, the memory device 100 may determine whether a program loop being currently performed is a program loop corresponding to a specific program state. In an embodiment, the specific program state may include a program state having a higher threshold voltage than the other program states among a plurality of program states.

When the program loop being currently performed is not the program loop corresponding to the specific program state, based on the determination result in the step S1703, the memory device 100 may perform step S1705.

In the step S1705, the memory device 100 may determine whether a verify operation on the plurality of program states has passed. When the verify operation on the plurality of program states fails, based on the determination result in the step S1705, the memory device 100 may again perform the steps S1701 and S1703. That is, the memory device 100 may repeatedly perform a program voltage apply operation and a verify operation until the verify operation on the plurality of program states passes. Alternatively, when the verify operation on the plurality of program states passes, based on the determination result in the step S1705, a program operation on selected memory cells may be ended.

Meanwhile, when the program loop being currently performed is the program loop corresponding to the specific program state, based on the determination result in the step S1703, the memory device 100 may perform step S1707. In the step S1707, the memory device 100 may apply a program voltage to the selected memory cells.

In step S1709, the memory device 100 verify a program state of memory cells programmed to the specific program state in a verify operation included in at least one program loop corresponding to the specific program state. For example, the memory device 100 may verify the program state of the memory cells programmed to the specific program state by applying a first verify voltage to a selected word line connected to the selected memory cells.

Meanwhile, in some embodiments, the order of the steps S1707 and S1709 may be changed.

In step S1711, the memory device 100 may verify an erase state of memory cells programmed to an erase state in the verify operation included in the at least one program loop corresponding to the specific program state. For example, the memory device 100 may verify the erase state of the memory cells programmed to the erase state by applying a second verify voltage to the selected word line. In an embodiment, the second verify voltage is a voltage lower than the first verify voltage, and may include a negative verify voltage.

In step S1713, the memory device 100 may determine whether a verify operation on the erase state has passed. For example, when a threshold voltage of the memory cells programmed to the erase state is higher than the second verify voltage, the memory device 100 may determine that the verify operation on the erase state has failed. Alternatively, when the threshold voltage of the memory cells programmed to the erase state is lower than the second verify voltage, the memory device 100 may determine that the verify operation on the erase state has passed.

When the verify operation on the erase state passes, based on the determination result in the step S1713, the memory device 100 may perform step S1705.

When it is determined that the verify operation on the erase state fails, based on the determination result in the step S1713, the memory device 100 may perform step S1715. In the step S1715, the memory device 100 may program data in other memory cells except the selected memory cells among a plurality of memory cells.

Figure 18:
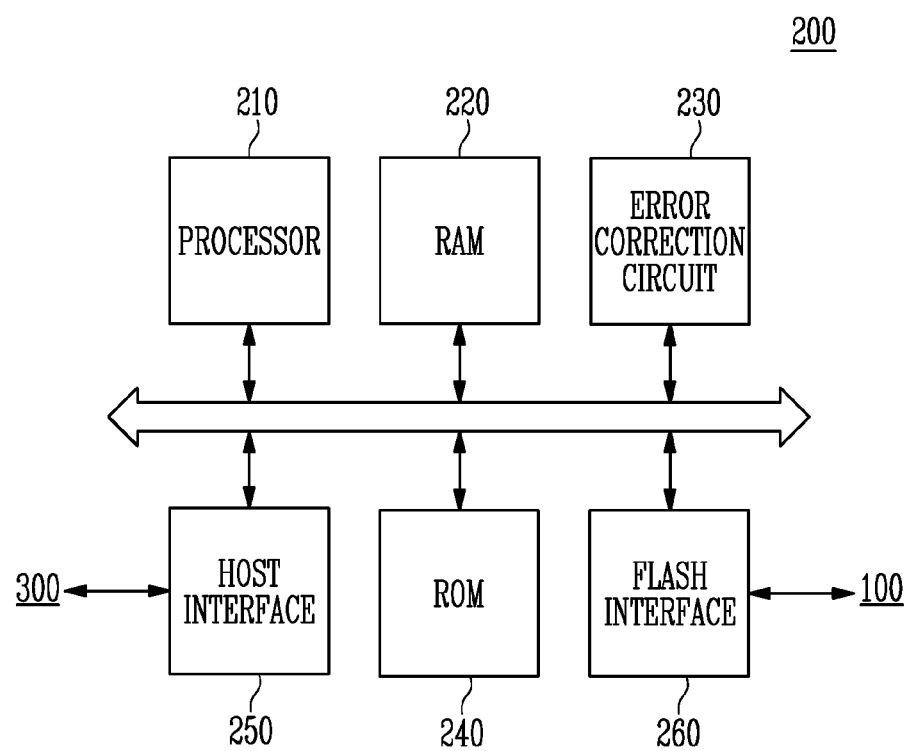
FIG. 18 is a diagram illustrating a memory controller shown in FIG. 1.

FIG. 18 is a diagram illustrating the memory controller shown in FIG. 1.

Referring to FIGS. 1 and 18, the memory controller 200 may include a processor 210, a RAM 220, an error correction circuit 230, a ROM 240, a host interface 250, and a flash interface 260.

The processor 210 may control overall operations of the memory controller 200. The RAM 220 may be used as a buffer memory, a cache memory, a working memory, etc. of the memory controller 200.

The error correction circuit 230 may perform error correction. The error correction circuit 230 may perform Error Correction Code (ECC) encoding, based on data to be written to the memory device 100 through the flash interface 260. The ECC-encoded data may be transferred to the memory device 100 through the flash interface 260. The error correction circuit 230 may perform ECC decoding on data received from the memory device 100 through the flash interface 260. For example, the error correction circuit 230 is a component of the flash interface 260, and may be included in the flash interface 260.

The ROM 240 may store, in the form of firmware, various information required in an operation of the memory controller 200.

The memory controller 200 may communicate with an external device (e.g., the host 300, an application processor, or the like) through the host interface 250.

The memory controller 200 may communicate with the memory device 100 through the flash interface 260. The memory controller 200 may transmit a command, an address, a control signal, and the like to the memory device 100 through the flash interface 260, and receive data. For example, the flash interface 260 may include a NAND interface.

Figure 19:
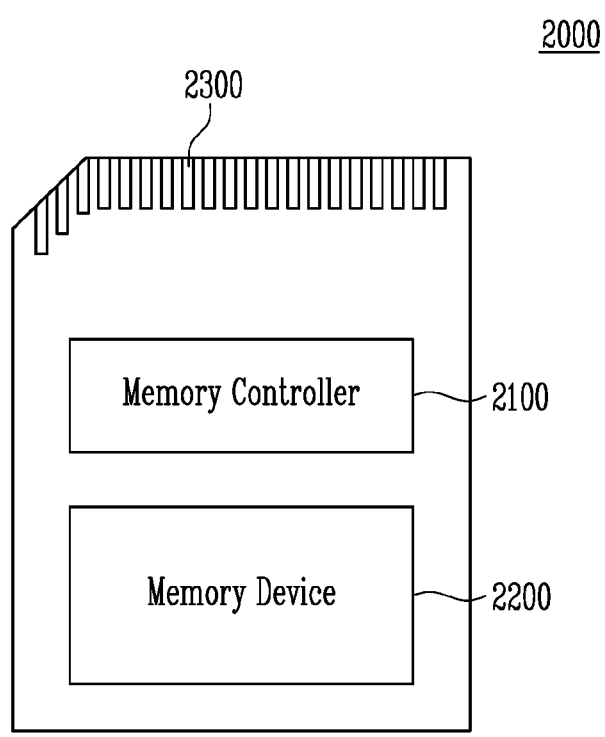
FIG. 19 is a block diagram illustrating a memory card system to which the storage device is applied in accordance with an embodiment of the present disclosure.

FIG. 19 is a block diagram illustrating a memory card system to which the storage device is applied in accordance with an embodiment of the present disclosure.

Referring to FIG. 19, the memory card system 2000 includes a memory controller 2100, a memory device 2200, and a connector 2300.

The memory controller 2100 is connected to the memory device 2200. The memory controller 2100 may access the memory device 2200. For example, the memory controller 2100 may control read, write, erase, and background operations of the memory device 2200. The memory controller 2100 provides an interface between the memory device 2200 and a host Host. The memory controller 2100 drives firmware for controlling the memory device 2200. The memory controller 2100 may be implemented identically to the memory controller 200 described with reference to FIG. 1. The memory device 2200 may be implemented identically to the memory device 100 described with reference to FIG. 1.

For example, the memory controller 2100 may include components such as a Random Access Memory (RAM), a processing unit, a host interface, a memory interface, and an ECC circuit.

The memory controller 2100 may communicate with an external device through the connector 2300. The memory controller 2100 may communicate with the external device (e.g., the host) according to a specific communication protocol. For example, the memory controller 2100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe. For example, the connector 2300 may be defined by at least one of the above-described various communication protocols.

For example, the memory device 2200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

The memory controller 2100 and the memory device 2200 may be integrated into a single semiconductor device, to constitute a memory card. For example, the memory controller 2100 and the memory device 2200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 20:
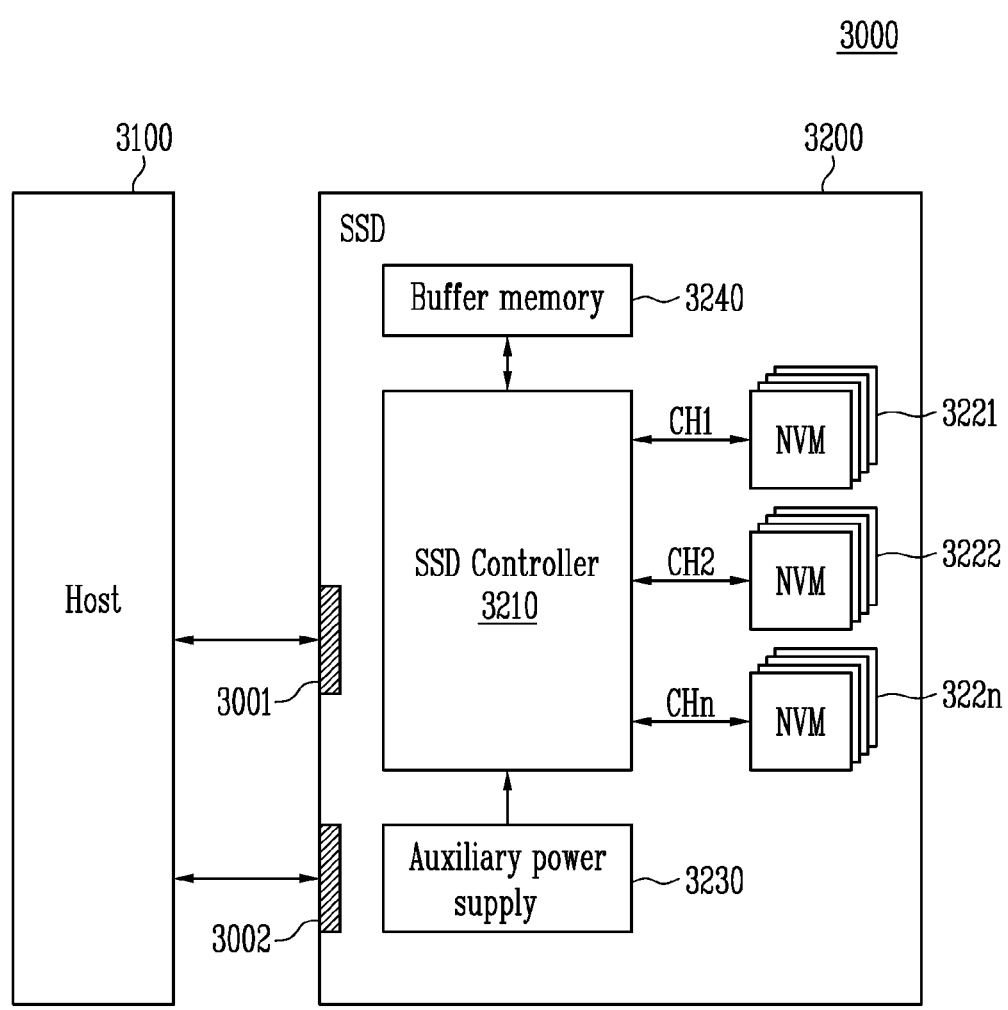
FIG. 20 is a block diagram illustrating a Solid State Drive (SSD) system to which the storage device is applied in accordance with an embodiment of the present disclosure.

FIG. 20 is a block diagram illustrating a Solid State Drive (SSD) system to which the storage device is applied in accordance with an embodiment of the present disclosure.

Referring to FIG. 20, the SSD system 3000 includes a host 3100 and an SSD 3200. The SSD 3200 exchanges a signal with the host 3100 through a signal connector 3001, and receives power through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may serve as the memory controller 200 described with reference to FIG. 1.

The SSD controller 3210 may control the plurality of flash memories 3221 to 322n in response to a signal received from the host 3100. For example, the signal may be a signal based on an interface between the host 3100 and the SSD 3200. For example, the signal may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is connected to the host 3100 through the power connector 3002. The auxiliary power supply 3230 may receive the power PWR input from the host 3100, and charge the power PWR. When the supply of power from the host 3100 is not smooth, the auxiliary power supply 3230 may provide power of the SSD 3200. For example, the auxiliary power supply 3230 may be located in the SSD 3200, or be located at the outside of the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 21:
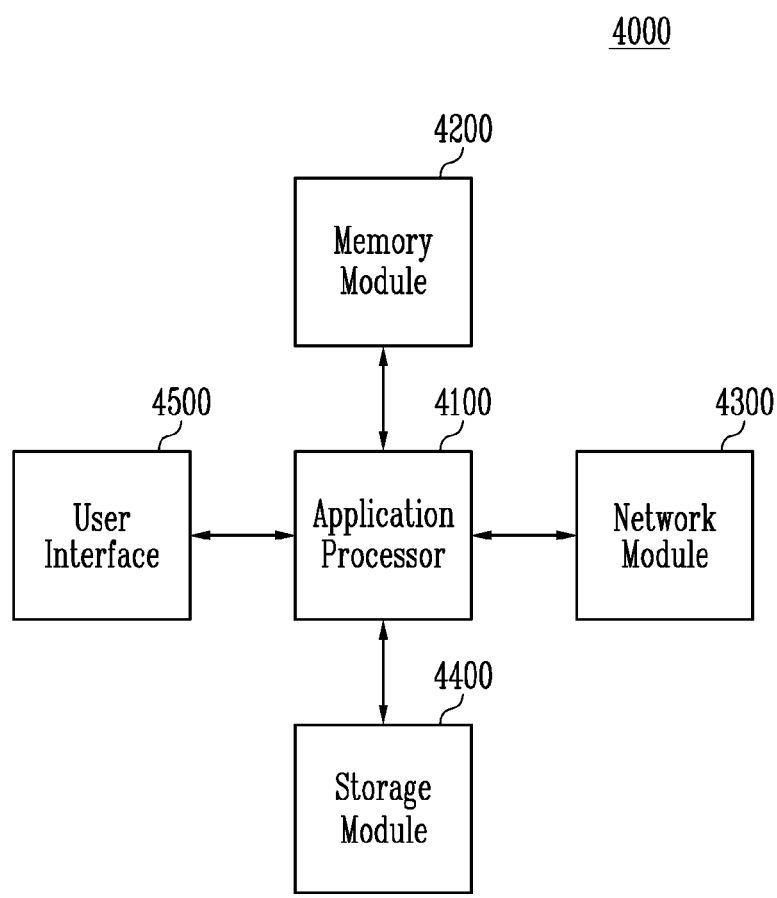
FIG. 21 is a block diagram illustrating a user system to which the storage device is applied in accordance with an embodiment of the present disclosure.

FIG. 21 is a block diagram illustrating a user system to which the storage device is applied in accordance with an embodiment of the present disclosure.

Referring to FIG. 21, the user system 4000 includes an application processor 4100, a memory module 4200, a network module 4300, a storage module 4400, and a user interface 4500.

The application processor 4100 may drive components included in the user system 4000, an operating system (OS), a user program, or the like. For example, the application processor 4100 may include controllers for controlling components included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. For example, the application processor 4100 and the memory module 4200 may be provided as one semiconductor package by being packaged based on a Package on Package (PoP).

The network module 4300 may communicate with external devices. For example, the network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. For example, the network module 4300 may be included in the application processor 4100.

The storage module 4400 may store data. For example, the storage module 4400 may store data received from the application processor 4100. Alternatively, the storage module 4400 may transmit data stored therein to the application processor 4100. For example, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. For example, the storage module 4400 may be provided as a removable drive such as a memory card of the user system 4000 or an external drive.

For example, the storage module 4400 may include a plurality of nonvolatile memory devices, and the plurality of nonvolatile memory devices may operate identically to the memory device 100 described with reference to FIG. 1. The storage module 4400 may operate identically to the storage device 50 described with reference to FIG. 1.

The user interface 4500 may include interfaces for inputting data or commands to the application processor 4100 or outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In accordance with the present disclosure, there can be provided a memory device capable of preventing read fail caused by memory cells in an erase state, and an operating method of the memory device.

While the present disclosure has been shown and described with reference to certain examples of embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described examples of embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the examples of embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A method for operating a memory device for performing a program operation of programming data in selected memory cells among a plurality of memory cells, the method comprising:
    applying a program voltage to the selected memory cells;
    verifying program states of memory cells programmed to any one program state among a plurality of program states distinguished based on a plurality of threshold voltages among the selected memory cells;
    applying a predetermined lowest program voltage to the selected memory cells after a verify operation on the plurality of program states passes; and
    verifying an erase state of memory cells programmed to an erase state among the selected memory cells after the lowest program voltage is applied to the selected memory cells.

2. The method of claim 1, wherein the verifying of the erase state comprises verifying the erase state of the memory cells programmed to the erase state, after the verify operation on the plurality of program states passes.

3. The method of claim 1, wherein the verifying of the program states comprises verifying the program states of the memory cells programmed to the one program state by applying a first verify voltage to a selected word line connected to the selected memory cells, and
    wherein the verifying of the erase state comprises verifying the erase state of the memory cells programmed to the erase state by applying a second verify voltage lower than the first verify voltage to the selected word line.

4. The method of claim 3, wherein the second verify voltage includes a negative verify voltage.

5. The method of claim 3, wherein the verifying of the erase state comprises determining that the verify operation on the erase state has failed, when a threshold voltage of the memory cells programmed to the erase state is higher than the second verify voltage.

6. The method of claim 5, further comprising programming the data in other memory cells except the selected memory cells among the plurality of memory cells, when the verify operation on the erase state has failed for the selected memory cells among the plurality of memory cells.

7. A method for operating a memory device for performing a program operation of programming data in selected memory cells among a plurality of memory cells, the method comprising:
    performing a plurality of program loops including a program voltage apply operation of applying a program voltage to the selected memory cells and a verify operation of verifying at least one of program states and an erase state of the selected memory cells;
    verifying program states of memory cells programmed to a specific program state among the selected memory cells in a verify operation included in at least one program loop corresponding to the specific program state among the plurality of program loops;
    applying a predetermined lowest program voltage to the selected memory cells after a verify operation on the specific program state passes; and
    verifying, after the lowest program voltage is applied to the selected memory cells, an erase state of memory cells programmed to an erase state among the selected memory cells in the verify operation included in the at least one program loop corresponding to the specific program state.

8. The method of claim 7, wherein the specific program state includes a program state having a higher threshold voltage than other program states among a plurality of program states.

9. The method of claim 7, wherein the verifying of the program state comprises verifying the program states of the memory cells programmed to the specific program state by applying a first verify voltage to a selected word line connected to the selected memory cells, and
    wherein the verifying of the erase state comprises verifying the erase state of the memory cells programmed to the erase state by applying a second verify voltage lower than the first verify voltage to the selected word line.

10. The method of claim 9, wherein the second verify voltage includes a negative verify voltage.

11. The method of claim 9, wherein the verifying of the erase state comprises determining that a verify operation on the erase state has failed, when a threshold voltage of the memory cells programmed to the erase state is higher than the second verify voltage.

12. The method of claim 11, further comprising programming the data in other memory cells except the selected memory cells among the plurality of memory cells, when the verify operation on the erase state has failed for the selected memory cells among the plurality of memory cells.

13. A memory device comprising:
    a plurality of memory cells;
    a peripheral circuit configured to perform a plurality of program loops including a program voltage apply operation of applying a program voltage to selected memory cells among the plurality of memory cells and a verify operation of verifying program states of the selected memory cells; and
    a program operation controller configured to control the peripheral circuit to program data in the selected memory cells according to the plurality of program loops,
    wherein the program operation controller controls the peripheral circuit to verify program states of memory cells programmed to any one program state among a plurality of program states distinguished based on a plurality of threshold voltages among the selected memory cells in the verify operation, apply a predetermined lowest program voltage to the selected memory cells after the verify operation on the plurality of program states passes, and verify an erase state of memory cells programmed to an erase state among the selected memory cells.

14. The memory device of claim 13, wherein the program operation controller controls the peripheral circuit to verify the erase state of the memory cells programmed to the erase state, after a verify operation on the plurality of program states passes.

15. The memory device of claim 13, wherein the program operation controller controls the peripheral circuit to verify the program states of the memory cells programmed to the specific program state among the selected memory cells and the erase state of the memory cells programmed to the erase state among the selected memory cells in a verify operation of at least one program loop corresponding to the specific program state among the plurality of program loops, and wherein the specific program state includes a program state having a higher threshold voltage than other program states among the plurality of program states.

16. The memory device of claim 13, wherein the program operation controller controls the peripheral circuit to apply a first verify voltage for verifying the program state of the memory cells programmed to the one program state to a selected word line connected to the selected memory cells, and apply a second verify voltage for verifying the erase state of the memory cells programmed to the erase state to the selected word line, and wherein the second verify voltage is lower than the first verify voltage.

17. The memory device of claim 16, wherein the second verify voltage includes a negative verify voltage.

18. The memory device of claim 16, wherein the program operation controller determines that a verify operation on the erase state has failed, when a threshold voltage of the memory cells programmed to the erase state is higher than the second verify voltage.

19. The memory device of claim 18, wherein, when the verify operation on the erase state has failed for the selected memory cells among the plurality of memory cells, the program operation controller controls the peripheral circuit to program the data in other memory cells except the selected memory cells among the plurality of memory cells.

* * * * *